United States Patent
Omura et al.

(10) Patent No.: US 8,854,601 B2
(45) Date of Patent: Oct. 7, 2014

(54) PROJECTION OPTICAL SYSTEM, EXPOSURE APPARATUS, AND EXPOSURE METHOD

(75) Inventors: Yasuhiro Omura, Tokyo (JP); Takaya Okada, Tokyo (JP); Hiroyuki Nagasaka, Tokyo (JP)

(73) Assignee: Nikon Corporation, Tokyo (JP)

( * ) Notice: Subject to any disclaimer, the term of this patent is extended or adjusted under 35 U.S.C. 154(b) by 237 days.

(21) Appl. No.: 13/229,589

(22) Filed: Sep. 9, 2011

(65) Prior Publication Data

US 2012/0002186 A1 Jan. 5, 2012

Related U.S. Application Data

(63) Continuation of application No. 11/920,332, filed as application No. PCT/JP2006/309254 on May 8, 2006, now abandoned.

(30) Foreign Application Priority Data

May 12, 2005 (JP) ................. 2005-139344

(51) Int. Cl.
*G03B 27/42* (2006.01)
*G03F 7/20* (2006.01)
*G02B 17/08* (2006.01)
*G02B 1/06* (2006.01)
*G02B 21/33* (2006.01)

(52) U.S. Cl.
CPC ............ *G02B 17/08* (2013.01); *G03F 7/70225* (2013.01); *G03F 7/70341* (2013.01); *G02B 17/0892* (2013.01); *G03F 7/702* (2013.01); *G02B 21/33* (2013.01); *G02B 1/06* (2013.01)
USPC .......................................... 355/53

(58) Field of Classification Search
CPC . G03F 7/70341; G03F 7/70225; G02B 17/08; G02B 21/33
USPC ...................................... 355/67, 53
See application file for complete search history.

(56) References Cited

U.S. PATENT DOCUMENTS 4,346,164 A 8/1982 Tabarelli et al.
4,624,555 A 11/1986 Tokuhara et al.
(Continued)

FOREIGN PATENT DOCUMENTS

CN 1501175 A 6/2004
CN 1573571 A 2/2005
(Continued)

OTHER PUBLICATIONS
International Search Report, dated Aug. 8, 2006, for corresponding PCT/JP2006/309254, filed May 8, 2006.
(Continued)

*Primary Examiner* — Peter D Kim
(74) *Attorney, Agent, or Firm* — Oliff PLC

(57) ABSTRACT

An immersion projection optical system having, for example, a catadioptric and off-axis structure, reduces the portion of an image space filled with liquid (immersion liquid). The projection optical system, which projects a reduced image of a first plane onto a second plane through the liquid, includes a refractive optical element (Lp) arranged nearest to the second plane. The refractive optical element includes a light emitting surface (Lpb) shaped to be substantially symmetric with respect to two axial directions (XY-axes) perpendicular to each other on the second plane. The light emitting surface has a central axis (Lpba) that substantially coincides with a central axis (40a) of a circle (40) corresponding to a circumference of a light entering surface (Lpa) of the refractive optical element. The central axis of the light emitting surface is decentered in one of the two axial directions (Y-axis) from an optical axis (AX).

21 Claims, 13 Drawing Sheets

(56) References Cited

U.S. PATENT DOCUMENTS

| | | | |
|---|---|---|---|
| 6,671,246 B1 | 12/2003 | Matsuo | |
| 6,909,492 B2 | 6/2005 | Omura | |
| 7,215,410 B2 | 5/2007 | Sumiyoshi | |
| 7,369,217 B2 | 5/2008 | Carroll | |
| 7,433,019 B2 | 10/2008 | Kiuchi et al. | |
| 7,697,111 B2 | 4/2010 | Shirai et al. | |
| 7,993,008 B2 | 8/2011 | Shirai et al. | |
| 8,149,381 B2 | 4/2012 | Shirai et al. | |
| 8,189,170 B2 | 5/2012 | Shirai et al. | |
| 2002/0027863 A1 | 3/2002 | Kikuchi et al. | |
| 2003/0011755 A1 | 1/2003 | Omura et al. | |
| 2004/0160582 A1 | 8/2004 | Lof et al. | |
| 2005/0232120 A1 | 10/2005 | Shinoda | |
| 2005/0237502 A1 | 10/2005 | Kawashima | |
| 2006/0077788 A1 | 4/2006 | Shinoda | |
| 2006/0077789 A1 | 4/2006 | Shinoda et al. | |
| 2006/0103821 A1 | 5/2006 | Hendricus Verspay et al. | |
| 2006/0197927 A1 | 9/2006 | Mulkens et al. | |
| 2006/0250601 A1 | 11/2006 | Streefkerk et al. | |
| 2008/0239503 A1* | 10/2008 | Conradi et al. | 359/666 |
| 2009/0002660 A1 | 1/2009 | Kiuchi | |
| 2009/0046268 A1 | 2/2009 | Omura et al. | |
| 2012/0002186 A1 | 1/2012 | Omura et al. | |
| 2013/0194560 A1 | 8/2013 | Omura et al. | |

FOREIGN PATENT DOCUMENTS

| | | |
|---|---|---|
| DE | 206 607 | 2/1984 |
| DE | 221 563 A1 | 4/1985 |
| DE | 224 448 A1 | 7/1985 |
| DE | 242 880 A1 | 2/1987 |
| DE | 100 29 938 A1 | 7/2001 |
| DE | 103 43 333 A1 | 4/2005 |
| EP | 0 023 231 A1 | 2/1981 |
| EP | 0 208 552 A2 | 1/1987 |
| EP | 0 656 555 A1 | 6/1995 |
| EP | 0 764 858 A2 | 3/1997 |
| EP | 1 211 561 A2 | 6/2002 |
| EP | 1 280 007 A2 | 1/2003 |
| EP | 1 489 462 A2 | 2/2004 |
| EP | 1 646 074 A1 | 4/2006 |
| EP | 1 674 935 A2 | 6/2006 |
| EP | 1 798 758 A1 | 6/2007 |
| EP | 1 806 611 | 7/2007 |
| EP | 1 881 521 A1 | 1/2008 |
| EP | 1 670 038 B1 | 6/2012 |
| FR | 2 474 708 | 7/1981 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |

(56) References Cited

FOREIGN PATENT DOCUMENTS

| | | |
|---|---|---|
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-21314 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |
| JP | A-5-217840 | 8/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |
| JP | A-6-29204 | 2/1994 |
| JP | A-6-42918 | 2/1994 |
| JP | A-6-53120 | 2/1994 |
| JP | A-6-97269 | 4/1994 |
| JP | A-6-104167 | 4/1994 |
| JP | A-6-120110 | 4/1994 |
| JP | B2-6-29102 | 4/1994 |
| JP | A-6-36054 | 5/1994 |
| JP | A-6-124126 | 5/1994 |
| JP | A-6-124872 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A-6-204121 | 7/1994 |
| JP | A-6-229741 | 8/1994 |
| JP | A-6-241720 | 9/1994 |
| JP | A-6-244082 | 9/1994 |
| JP | A-6-267825 | 9/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-7-69621 | 3/1995 |
| JP | A-7-92424 | 4/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-7-147223 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-215208 | 9/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-92735 | 4/1998 |

(56) References Cited

FOREIGN PATENT DOCUMENTS

| | | |
|---|---|---|
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | 10-303114 | 11/1998 |
| JP | A-10-294268 | 11/1998 |
| JP | A-10-303114 | 11/1998 |
| JP | A-10-340846 | 12/1998 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | A-2002-66428 | 3/2002 |
| JP | A-2002-71513 | 3/2002 |
| JP | A-2002-75816 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |

(56) References Cited

FOREIGN PATENT DOCUMENTS

| | | |
|---|---|---|
| JP | A-2002-323658 | 11/2002 |
| JP | A-2002-324743 | 11/2002 |
| JP | A-2002-329651 | 11/2002 |
| JP | A-2002-334836 | 11/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-17003 | 1/2003 |
| JP | A-2003-17404 | 1/2003 |
| JP | A-2003-28673 | 1/2003 |
| JP | A-2003-59 826 | 2/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59803 | 2/2003 |
| JP | A-2003-59821 | 2/2003 |
| JP | A-2003-68600 | 3/2003 |
| JP | A-2003-75703 | 3/2003 |
| JP | A-2003-81654 | 3/2003 |
| JP | A-2003-84445 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-224961 | 8/2003 |
| JP | A-2003-229347 | 8/2003 |
| JP | A-2003-233001 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A-2003-282423 | 10/2003 |
| JP | A-2003-297727 | 10/2003 |
| JP | A-2003-307679 | 10/2003 |
| JP | A-2003-532281 | 10/2003 |
| JP | A-2003-532282 | 10/2003 |
| JP | A-2003-311923 | 11/2003 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-63847 | 2/2004 |
| JP | A-2004-71851 | 3/2004 |
| JP | A-2004-85612 | 3/2004 |
| JP | A-2004-87987 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-111569 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-260115 | 7/2004 |
| JP | A-2004-221253 | 8/2004 |
| JP | A-2004-224421 | 8/2004 |
| JP | A-2004-228497 | 8/2004 |
| JP | A-2004-241666 | 8/2004 |
| JP | 2004-259966 | 9/2004 |
| JP | A-2004-247527 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356205 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-11990 | 1/2005 |
| JP | A-2005-12228 | 1/2005 |
| JP | A-2005-19628 | 1/2005 |
| JP | A-2005-19864 | 1/2005 |
| JP | A-2005-26634 | 1/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-93948 | 4/2005 |
| JP | A-2005-97057 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |

(56) References Cited

FOREIGN PATENT DOCUMENTS

| | | |
|---|---|---|
| JP | A-2005-127460 | 5/2005 |
| JP | A-2005-136404 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2005-536775 | 12/2005 |
| JP | A-2006-1821 | 1/2006 |
| JP | A-2006-5197 | 1/2006 |
| JP | A-2006-17895 | 1/2006 |
| JP | A-2006-19702 | 1/2006 |
| JP | A-2006-24706 | 1/2006 |
| JP | A-2006-24819 | 1/2006 |
| JP | A-2006-32750 | 2/2006 |
| JP | A-2006-41302 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-100363 | 4/2006 |
| JP | A-2006-100686 | 4/2006 |
| JP | A-2006-120985 | 5/2006 |
| JP | A-2006-128192 | 5/2006 |
| JP | A-2006-135165 | 5/2006 |
| JP | 2006-140494 | 6/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-245590 | 9/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-289684 | 10/2006 |
| JP | A-2006-121009 | 11/2006 |
| JP | A-2006-349946 | 12/2006 |
| JP | A-2006-351586 | 12/2006 |
| JP | A-2007-5830 | 1/2007 |
| JP | A-2007-43980 | 2/2007 |
| JP | A-2007-48819 | 2/2007 |
| JP | A-2007-51300 | 3/2007 |
| JP | A-2007-507881 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-170938 | 7/2007 |
| JP | A-2007-187649 | 7/2007 |
| JP | A-2007-207821 | 8/2007 |
| JP | A-2007-227637 | 9/2007 |
| JP | A-2007-235041 | 9/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-58580 | 3/2008 |
| JP | A-2008-64924 | 3/2008 |
| JP | A-2008-103737 | 5/2008 |
| JP | A-2008-180492 | 8/2008 |
| JP | A-2009-17540 | 1/2009 |
| JP | A-2009-60339 | 3/2009 |
| JP | A-2012-014174 | 1/2012 |
| JP | A-2012-155330 | 8/2012 |
| JP | A-2012-168543 | 9/2012 |
| WO | WO 97/11411 A1 | 3/1997 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | 9949504 | 9/1999 |
| WO | WO 99/49366 A1 | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/11706 A1 | 3/2000 |
| WO | WO 00/67303 | 4/2000 |
| WO | WO 00/67303 A1 | 11/2000 |
| WO | WO 01/03170 A1 | 1/2001 |
| WO | WO 01/10137 A1 | 2/2001 |
| WO | WO 01/22480 A1 | 3/2001 |
| WO | WO 01/27978 A1 | 4/2001 |
| WO | WO 01/59502 A1 | 8/2001 |
| WO | WO 01/65296 A1 | 9/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/101804 A1 | 12/2002 |
| WO | WO 03/023832 A1 | 3/2003 |
| WO | WO 03/063212 A1 | 7/2003 |
| WO | WO 03/077036 A1 | 9/2003 |
| WO | WO 03/085708 A1 | 10/2003 |
| WO | 2004/019128 | 3/2004 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/071070 A2 | 8/2004 |
| WO | 2004/092830 | 10/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |

(56) References Cited

FOREIGN PATENT DOCUMENTS

| | | |
|---|---|---|
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006417 A1 | 1/2005 |
| WO | WO 2005/006418 A1 | 1/2005 |
| WO | WO 2005/008754 A1 | 1/2005 |
| WO | WO 2005/020298 A1 | 3/2005 |
| WO | WO 2005/022615 A1 | 3/2005 |
| WO | WO 2005/026843 A2 | 3/2005 |
| WO | WO 2005/029559 A1 | 3/2005 |
| WO | 2005/034174 | 4/2005 |
| WO | WO 2005/036619 A1 | 4/2005 |
| WO | WO 2005/036620 A1 | 4/2005 |
| WO | WO 2005-036622 A1 | 4/2005 |
| WO | WO 2005/036623 A1 | 4/2005 |
| WO | WO 2005/041276 A1 | 5/2005 |
| WO | WO 2005/048325 A1 | 5/2005 |
| WO | WO 2005/048326 A1 | 5/2005 |
| WO | WO 2005/057636 A1 | 6/2005 |
| WO | WO 2005/067013 A1 | 7/2005 |
| WO | WO 2005/071717 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006-006730 A1 | 1/2006 |
| WO | WO 2006-016551 A1 | 2/2006 |
| WO | WO 2006/019124 A1 | 2/2006 |
| WO | WO 2006-025341 A1 | 3/2006 |
| WO | WO 2006-028188 A1 | 3/2006 |
| WO | WO 2006-030727 A1 | 3/2006 |
| WO | WO 2006/030910 A1 | 3/2006 |
| WO | 2006/043457 | 4/2006 |
| WO | WO 2006-035775 A1 | 4/2006 |
| WO | WO 2006-049134 A1 | 5/2006 |
| WO | WO 2006/051909 A1 | 5/2006 |
| WO | WO 2006/064851 A1 | 6/2006 |
| WO | WO 2006-068233 A1 | 6/2006 |
| WO | WO 2006-077958 A1 | 7/2006 |
| WO | WO 2006/085524 A1 | 8/2006 |
| WO | WO 2006/100889 A1 | 9/2006 |
| WO | WO 2006-118108 A1 | 11/2006 |
| WO | WO 2007/003563 A1 | 1/2007 |
| WO | WO 2007-018127 A1 | 2/2007 |
| WO | WO 2007/055237 A1 | 5/2007 |
| WO | WO 2007/055373 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/132862 A1 | 11/2007 |
| WO | WO 2007/141997 A1 | 12/2007 |
| WO | WO 2008/041575 A1 | 4/2008 |
| WO | WO 2008/059748 A1 | 5/2008 |
| WO | WO 2008/061681 A2 | 5/2008 |
| WO | WO 2006-343023 | 6/2008 |
| WO | WO 2008/065977 A1 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Supplementary European Search Report, dated Apr. 23, 2010, issued in corresponding European Patent Application No. EP 06 746 085.
Office Action, dated Jul. 4, 2011, issued in European Patent Application No. EP 06 746 085.
Jul. 30, 2013 Office Action issued in Korean Application No. 10-2007-7027046 (with translation).
Sep. 12, 2012 Office Action issued in Korean Patent Application No. 10-2007-7027046 (with translation).
Oct. 23, 2012 Office Action issued in Japanese Application No. 2007-528269 (with translation).
Mar. 5, 2013 Office Action issued in Japanese Patent Application No. P2007-528269 (with translation).
Apr. 23, 2013 Office Action issued in Japanese Application No. P2011-148301 (with translation).
Jun. 19, 2012 Office Action issued in Japanese Patent Application No. 2007-528269 (with translation).
Mar. 18, 2011 European Search Report issued in European Patent Application No. 2 284 615.
Mar. 22, 2011 European Search Report issued in European patent Application No. 2 278 402.
Jul. 30, 2013 Office Action issued in Japanese Patent Application No. P2011-148301 (with translation).
Office Action cited in European Application No. 06 746 085.7 mailed Jul. 23, 2013.
Apr. 23, 2010 Supplemental European Search Report issued in European Application No. 06 74 6085.7.
Jul. 7, 2011 Office Action issued in European Application No. 06 746 085.7.
May 26, 2010 Office Action issued in U.S. Appl. No. 11/920,332.
Sep. 9, 2010 Office Action issued in U.S. Appl. No. 11/920,332.
Mar. 9, 2011 Office Action issued in U.S. Appl. No. 11/920,332.
Oct. 7, 2013 Office Action issued in Korean Application No. 10-2013-7021609 (with English translation).
Nov. 5, 2013 Office Action issue in Japanese Application No. P2007-528269 (with English translation).
Dec. 3, 2013 Office Action issued in Japanese Patent Application No. 2012-076984 (with translation).
Dec. 3, 2013 Office Action issued in Japanese Patent Application No. 2012-077000 (with translation).
Dec. 17, 2013 Office Action issued in Japanese Patent Application No. 2011-148301 (with translation).
Office Action dated Mar. 31, 2014 issued in Korean Patent Application No. 10-2007-7027046 (W/English Translation).

* cited by examiner

Fig. 8
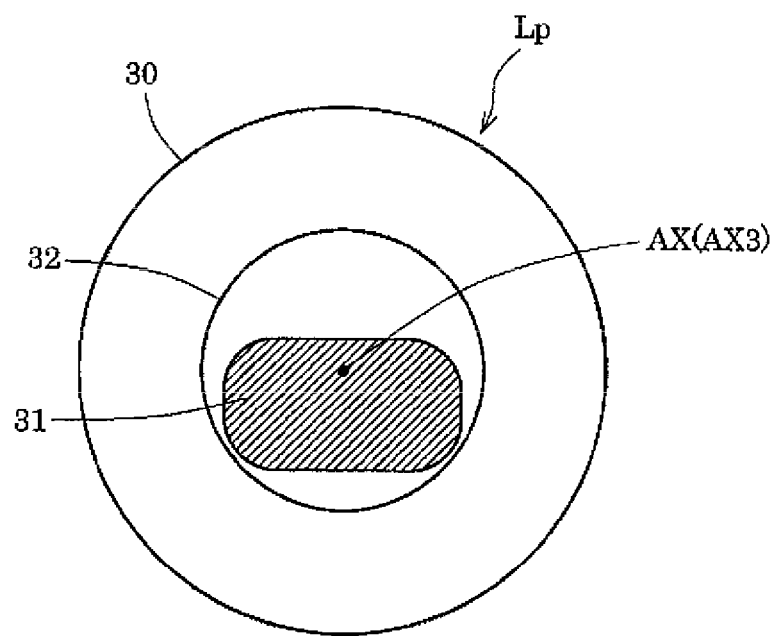
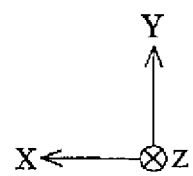

Fig.10(a)
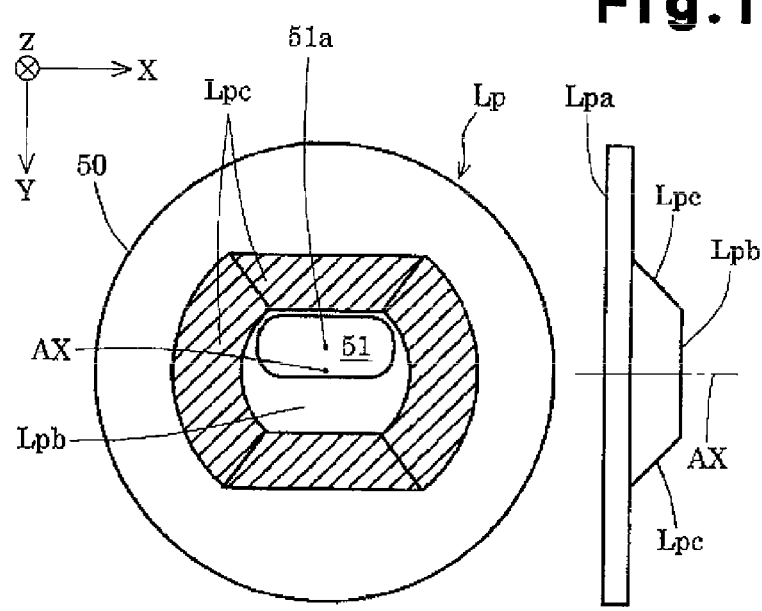
Fig.10(c)
Fig.10(b)
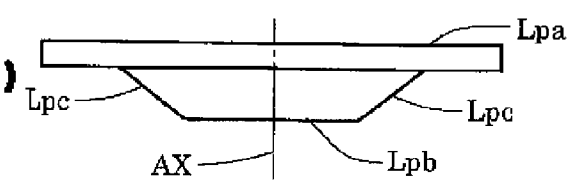

PROJECTION OPTICAL SYSTEM, EXPOSURE APPARATUS, AND EXPOSURE METHOD

CROSS REFERENCE TO RELATED APPLICATIONS

This application is a continuation of application Ser. No. 11/920,332, filed on Nov. 9, 2007 now abandoned, which is a U.S. national-phase application (35 U.S.C. §371) of, claims priority to, and claims the benefit of International Application No. PCT/JP2006/309254, filed on May 8, 2006, which is incorporated herein by reference in its entirety, and which claims priority to and the benefit of Japan Patent Application No. 2005-139344, filed on May 12, 2005.

TECHNICAL FIELD

The present invention relates to a projection optical system, an exposure apparatus, and an exposure method, and more particularly, to a projection optical system optimal for an exposure apparatus used to manufacture microdevices, such as semiconductor devices and liquid crystal display devices, through a photolithography process.

BACKGROUND ART

An exposure apparatus projects and exposes an image of a pattern of a mask (or a reticle) on a photosensitive substrate (e.g., wafer or a glass plate coated by a photoresist). More specifically, the exposure apparatus uses a projection optical system to project and expose the image in a photolithography process, in which semiconductor devices or the like are manufactured. The projection optical system is required to have a higher resolution due to the increasing level of integration of semiconductor devices or the like manufactured with the exposure apparatus.

To improve the resolution of the projection optical system, the projection optical system needs to shorten the wavelength $\lambda$ of its illumination light (exposure light) and increase the numerical aperture NA at its image side. The resolution of the projection optical system is written as $k*\lambda/NA$ (where k is a process coefficient). The image-side numerical aperture NA is written as $n*\sin\theta$, where n is the refractive index of a medium (usually gas, such as air) that arranged between the projection optical system and the photosensitive substrate, and $\theta$ is the maximum incident angle at which light enters the photosensitive substrate.

When the maximum angle $\theta$ is set larger in an effort to increase the image-side numerical aperture, the angle at which light is emitted from the projection optical system and the angle at which the light enters the photosensitive substrate increase. This increases reflection loss occurring at an optical surface. As a result, the projection optical system cannot obtain a large effective numerical aperture at its image side. One conventional technique for increasing the image-side numerical aperture is an immersion technique (refer to, for example, Patent Document 1), with which an optical path formed between a projection optical system and a photosensitive substrate is filled with a medium such as a liquid having a high refractive index.

Patent Document 1: International Patent Publication No. WO2004/019128

DISCLOSURE OF THE INVENTION

Problems to be Solved by the Invention

As described above, the conventional technique of filling an image space with a liquid medium having a higher refractive index than a gas medium enables the projection optical system to have an image-side numerical aperture that is greater than 1 and improves the resolution of the projection optical system, which is used in an exposure apparatus. However, microlithography, through which micropatterns are formed, always needs to consider chip costs. To reduce chip costs, the predominant immersion lithography system is a local immersion lithography system, which uses a mechanism for supplying and discharging liquid to and from only a limited portion of an image space of a projection optical system. To prevent enlargement of a substrate stage (wafer stage) of the projection optical system and improve the accuracy of an alignment optical system, the local immersion system is required to minimize the portion of the image space in the projection optical system that is filled with the liquid (immersion liquid).

An immersion projection optical system may have, for example, an image-side numerical aperture that is greater than 1.2. An immersion projection optical system with such an image-side numerical aperture preferably employs a catadioptric projection optical system structure to satisfy Petzval's condition and ensure the flatness of an image. A immersion projection optical system with such an image-side numerical aperture also preferably employs an off-axis optical system structure, in which an effective field of view region and an effective projection region do not extend on an optical axis of the projection optical system (the regions are "off" the optical axis), to increase the variety of patterns of images that can be formed. When a catadioptric and off-axis immersion projection optical system is employed, images can be produced with a greater maximum height than a conventional refractive projection optical system. However, if a refractive optical element arranged nearest to an imaging position in the projection optical system is formed to have a light emitting surface that is rotationally symmetric with respect to the optical axis in accordance with the conventional technique, a large portion of an image space of the projection optical system will be filled with the liquid. As a result, the substrate stage may be enlarged or the accuracy of the alignment optical system may be lowered.

The present invention has been made to solve the above problems. It is an object of the present invention to provide an immersion projection optical system with, for example, a catadioptric and off-axis structure that reduces the portion of an image space filled with liquid (immersion liquid). It is another object of the present invention to provide an exposure apparatus and an exposure method that use a high-resolution immersion projection optical system, which reduces the portion of an image space filled with liquid, and enable a micropattern to be projected and exposed with a high accuracy without enlarging a substrate stage of the projection optical system or lowering the accuracy of an alignment optical system of the projection optical system.

Means of Solving the Problems

To achieve the above object, a first aspect of the present invention provides a projection optical system for projecting an image of a first plane onto a second plane through a liquid. The projection optical system includes a refractive optical element arranged nearest to the second plane. The refractive optical element includes a light emitting surface shaped to be rotationally asymmetric with respect to an optical axis of the projection optical system in accordance with the shape of an effective projection region formed on the second plane. The phrase "shaped to be rotationally asymmetric" refers to a state having "a shape other than an infinitely symmetric rotation".

A second aspect of the present invention provides a projection optical system for projecting an image of a first plane onto a second plane through a liquid. The projection optical system includes a refractive optical element arranged nearest to the second plane. The refractive optical element includes a light emitting surface shaped to be two-fold rotationally symmetric with respect to an optical axis of the projection optical system.

A third aspect of the present invention provides a projection optical system for projecting an image of a first plane onto a second plane through a liquid. The projection optical system includes a refractive optical element arranged nearest to the second plane. The refractive optical element includes a light emitting surface shaped to be substantially symmetric with respect to two axial directions perpendicular to each other on the second plane, and the light emitting surface has a central axis that substantially coincides with an optical axis and a central axis of a circle corresponding to a circumference of a light entering surface of the refractive optical element.

A fourth aspect of the present invention provides a projection optical system for projecting an image of a first plane onto a second plane through a liquid. The projection optical system includes a refractive optical element arranged nearest to the second plane. The refractive optical element includes a light emitting surface shaped to be one-fold rotationally symmetric with respect to an optical axis of the projection optical system.

A fifth aspect of the present invention provides a projection optical system for projecting an image of a first plane onto a second plane through a liquid. The projection optical system includes a refractive optical element arranged nearest to the second plane. The refractive optical element includes a light emitting surface shaped to be substantially symmetric with respect to two axial directions perpendicular to each other on the second plane. The light emitting surface has a central axis that substantially coincides with a central axis of a circle corresponding to a circumference of a light entering surface of the refractive optical element, and the central axis of the light emitting surface is decentered in one of the two axial directions from the optical axis.

A sixth aspect of the present invention provides a projection optical system for projecting an image of a first plane onto a second plane through a liquid. The projection optical system includes a refractive optical element arranged nearest to the second plane. The refractive optical element includes a light emitting surface shaped to be substantially symmetric with respect to one of two axial directions perpendicular to each other and asymmetric with respect to the other one of the axial directions on the second plane, a central axis of a circle corresponding to a circumference of a light entering surface of the refractive optical element substantially coincides with the optical axis, and the light emitting surface has a central axis decentered in one of the two axial directions from the optical axis.

A seventh aspect of the present invention provides a projection optical system for projecting an image of a first plane onto a second plane through a liquid. The projection optical system includes a refractive optical element arranged nearest to the second plane. The refractive optical element includes a light emitting surface shaped to be substantially symmetric with respect to two axial directions perpendicular to each other on the second plane, a central axis of a circle corresponding to a circumference of a light entering surface of the refractive optical element substantially coincides with the optical axis, and the light emitting surface has a central axis decentered in one of the axial directions from the optical axis.

An eighth aspect of the present invention provides a projection optical system for projecting an image of a first plane onto a second plane through a liquid. The projection optical system includes a refractive optical element arranged nearest to the second plane. When two axial directions perpendicular to each other are set on the second plane, a light emitting surface of the refractive optical element has a length in one of the axial directions and a length in the other one of the axial directions that differ from each other.

A ninth aspect of the present invention provides an exposure apparatus including the projection optical system according to any one of the first to eighth aspects for projecting an image of a predetermined pattern onto a photosensitive substrate that is set on the second plane based on illumination light from the pattern set on the first plane.

A tenth aspect of the present invention provides an exposure method including a setting step of setting a predetermined pattern on the first plane, and an exposure step of projecting and exposing an image of the pattern onto a photosensitive substrate that is set on the second plane with the projection optical system according to any one of claims 1 to 35 based on illumination light from the predetermined pattern.

An eleventh aspect of the present invention provides a device manufacturing method including an exposure step of projecting and exposing an image of a pattern set on the first plane onto a photosensitive substrate set on the second plane with the projection optical system according to any one of the first to eighth aspects, and a development step of developing the photosensitive substrate that has undergone the exposure step.

A twelfth aspect of the present invention provides a refractive optical element for use in an immersion objective optical system that forms an image of a first plane onto an effective projection region on a second plane. One optical surface comes in contact with a liquid. The one optical surface of the refractive optical element is shaped to be rotationally asymmetric with respect to an optical axis of the immersion objective optical system in accordance with a shape of the effective projection region on the second plane.

A thirteenth aspect of the present invention provides a refractive optical element for use in an immersion objective optical system that forms an image of a first plane on a second plane. One optical surface comes in contact with a liquid. When two axial directions perpendicular to each other are set on the second plane, the one optical surface of the refractive optical element has a length in one of the axial directions and a length in the other one of the axial directions that differ from each other.

Effect of the Invention

The immersion projection optical system according to a typical aspect of the present invention has, for example, a catadioptric and off-axis structure, in which a light emitting surface of a refractive optical element that is arranged nearest to an imaging position is rotationally-asymmetric with respect to an optical axis of the projection optical system according to the shape of an effective projection region formed on an image surface. More specifically, the light emitting surface of the refractive optical element is substantially symmetric with respect to two axial directions that are perpendicular to each other on the image surface. A central axis of the light emitting surface and a central axis of a circle corresponding to a circumference of a light entering surface of the refractive optical element substantially coincide with each other. The central axis of the light emitting surface is decentered along one of the two axial directions with respect to the optical axis.

As a result, the light emitting surface of the refractive optical element that is arranged nearest to the imaging position in the projection optical system of the present invention is rotationally-asymmetric in accordance with the shape of the effective projection region. The projection optical system of the present invention reduces the portion of an image space filled with liquid (immersion liquid). Further, the exposure apparatus and the exposure method of the present invention use a high-resolution immersion projection optical system, which reduces a portion of an image space filled with liquid, and enable a micropattern to be projected and exposed with a high accuracy without enlarging a substrate stage of the projection optical system or lowering the accuracy of an alignment optical system of the projection optical system. Consequently, this produces a satisfactory microdevice with high accuracy.

BRIEF DESCRIPTION OF THE DRAWINGS

FIG. 8 is a diagram illustrating problems occurring when a light emitting surface of a refractive optical element arranged nearest to an imaging position is formed rotationally symmetric in the prior art;

FIG. 10 is a schematic diagram showing the structure of an immersed plane parallel plate according to a first modification of the present embodiment;

DESCRIPTION OF REFERENCE NUMERALS

Figure 1:
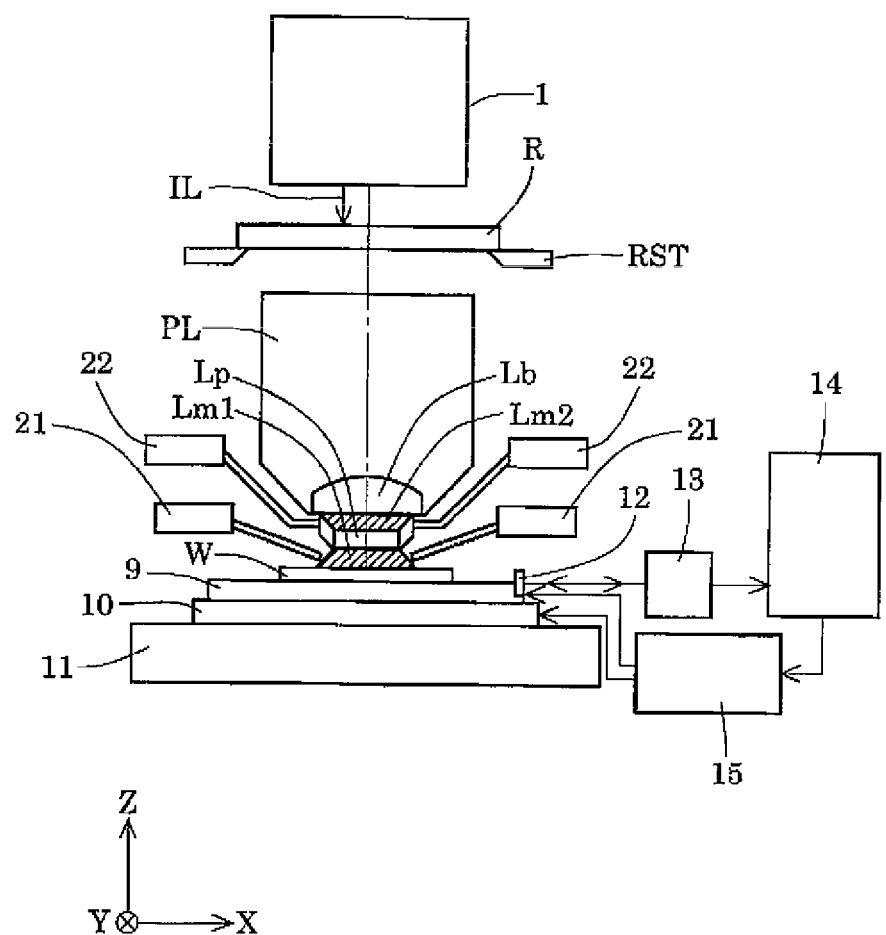
FIG. 1 is a schematic diagram showing the structure of an exposure apparatus according to a present embodiment of the present invention.

R reticle
RST reticle stage
PL projection optical system
Lp interface lens
Lp immersed plane parallel plate
Lm1, Lm2 pure water (liquid)
W wafer
1 illumination optical system
9 Z-stage
10 XY-stage
12 movable mirror
13 wafer laser interferometer
14 main control system
15 wafer stage drive system
21 first supply and discharge mechanism
22 second supply and discharge mechanism

BEST MODE FOR CARRYING OUT THE INVENTION

An embodiment of the present invention will now be described with reference to the drawings. FIG. 1 is a schematic diagram showing the structure of an exposure apparatus of the present embodiment of the present invention. In FIG. 1, X-axis and Y-axis are directions parallel to a wafer W, whereas Z-axis is a direction perpendicular to the wafer W. More specifically, the XY surface is parallel to the horizontal surface, and +Z-axis is oriented upward in the vertical direction.

The exposure apparatus of the present embodiment includes an ArF excimer laser light source, which functions for example as an exposure light source, and an illumination optical system 1 as shown in FIG. 1. The illumination optical system 1 includes an optical integrator (homogenizer), a field stop, and a condenser lens. Exposure light (an exposure beam) IL, which is ultraviolet pulsed light having a wavelength of 193 nm, is emitted from the light source, passes through the illumination optical system 1, and illuminates a reticle (mask) R. The reticle R has a pattern that is to be transferred. The entire pattern region on the reticle R includes a rectangular (slit) pattern region of which long sides extend in X-axis direction and of which short sides extend in the Y-axis direction. The exposure beam IL illuminates the rectangular pattern region on the reticle R.

Light that has passed through the reticle R enters an immersion projection optical system PL. The projection optical system PL projects the reticle pattern with a predetermined reduction ratio onto the wafer (photosensitive substrate) W that is coated with a photoresist. The projection optical system PL forms an image of the reticle pattern on the wafer W. More specifically, the projection optical system PL forms the pattern image on a rectangular stationary exposure region (effective exposure region) of which long sides extend in the X-axis direction and of which short sides extend in the Y-axis direction on the wafer W, which optically corresponds to the rectangular illumination region formed on the reticle R.

Figure 2:
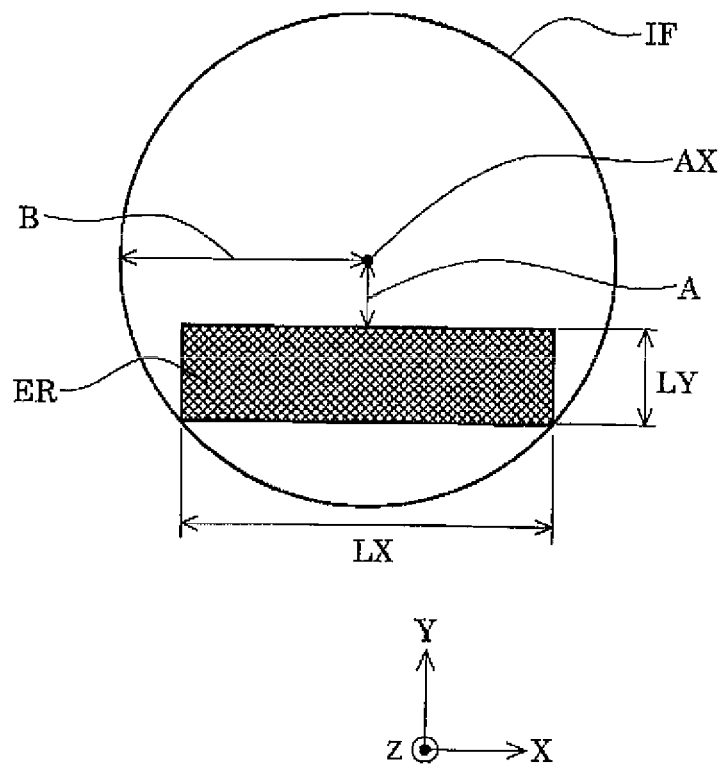
FIG. 2 shows the positional relationship between a rectangular stationary exposure region formed on a wafer and a reference optical axis in the present embodiment of the present invention.

FIG. 2 shows the positional relationship between the rectangular stationary exposure region (effective exposure region) that is formed on the wafer and a reference optical axis in the present embodiment. In the present embodiment, as shown in FIG. 2, the rectangular effective exposure region ER having a predetermined size is defined at a position distant from the reference optical axis AX in the Y-axis direction by an off-axis amount A within a circular region (image circle) IF. The center of the image circle IF coincides with the reference optical axis AX. The image circle IF has a radius B.

The effective exposure region ER has a length LX in the X-axis direction and a length LY in the Y-axis direction. Although not shown in the drawing, the rectangular illumination region (effective illumination region) corresponding to the rectangular effective exposure region ER is formed on the reticle R. More specifically, a rectangular illumination region having a size and shape corresponding to the effective exposure region ER is formed on the reticle R at a position distant from the reference optical axis AX in the Y-axis direction by the off-axis amount A.

A reticle stage RST supports the reticle R in such a manner that the reticle R is parallel to the XY surface. The reticle stage RST incorporates a mechanism for slightly moving the reticle R in the X-axis direction, the Y-axis direction, and a rotation direction. The positions of the reticle stage RST in the X-axis direction, the Y-axis direction, and the rotation direction are measured and controlled in real time by a reticle laser interferometer (not shown). A wafer holder (not shown) fixes the wafer W to a Z-stage 9 in a manner that the wafer W is parallel to the XY surface.

The Z-stage 9 is fixed to an XY-stage 10. The XY-stage 10 moves along the XY surface, which is substantially parallel to an image surface of the projection optical system PL. The Z-stage 9 controls the focus position (Z-axis position) and the tilt angle of the wafer W. The positions of the Z-stage 9 in the X-axis direction, the Y-axis direction, and the rotation direction are measured and controlled in real time by a wafer laser interferometer 13. The wafer laser interferometer 13 uses a movable mirror 12, which is arranged on the Z-stage 9.

The XY-stage 10 is mounted on a base 11. The XY-stage 10 controls the positions of the wafer W in the X-axis direction, the Y-axis direction, and the rotation direction. A main control system 14, which is mounted on the exposure apparatus of the present embodiment, adjusts the positions of the reticle R in the X-axis direction, the Y-axis direction, and the rotation direction based on the values measured by the reticle laser interferometer. More specifically, the main control system 14 transmits a control signal to mechanisms incorporated in the reticle stage RST, and positions the reticle R by slightly moving the reticle stage RST.

The main control system 14 adjusts the focus position (Z-axis position) and the tilt angle of the wafer W to align the surface of the wafer W to the image surface of the projection optical system PL through autofocusing and automatic leveling. More specifically, the main control system 14 transmits a control signal to a wafer stage drive system 15 and drives the Z-stage 9 using the wafer stage drive system 15 to adjust the focus position and the tilt angle of the wafer W.

The main control system 14 further adjusts the positions of the wafer W in the X-axis direction, the Y-axis direction, and the rotation direction based on the values measured by the wafer laser interferometer 13. More specifically, the main control system 14 transmits a control signal to the wafer stage drive system 15, and adjusts the positions of the wafer W in the X-axis direction, the Y-axis direction, and the rotation direction by driving the XY stage 10 using the wafer stage drive system 15.

During exposure, the main control system 14 transmits a control signal to mechanisms incorporated in the reticle stage RST and also transmits a control signal to the wafer stage drive system 15. This drives the reticle stage RST and the XY-stage 10 at a speed ratio determined by the projection magnitude of the projection optical system PL, while the pattern image of the reticle R is projected and exposed within a predetermined shot region formed on the wafer W. Afterwards, the main control system 14 transmits a control signal to the wafer stage drive system 15, and drives the XY-stage 10 using the wafer stage drive system 15 to cause a step movement of the exposure position to another shot region formed on the wafer W.

The pattern image of the reticle R is repeatedly scanned and exposed on the wafer W with the step-and-scan method as described above. More specifically, the reticle stage RST and the XY-stage 10 and consequently the reticle R and the wafer W are moved (scanned) in synchronization in the short-side direction of the rectangular stationary exposure region and the stationary illumination region, or the Y-axis direction, while the positions of the reticle R and the wafer W are adjusted using the wafer stage drive system 15 and the wafer laser interferometer 13 or the like. Through this operation, the reticle pattern is scanned and exposed in the region on the wafer W that has the same length as the length of the long side LX of the stationary exposure region and has the same width as the width corresponding to the scanning amount (moving amount) of the wafer W.

Figure 3:
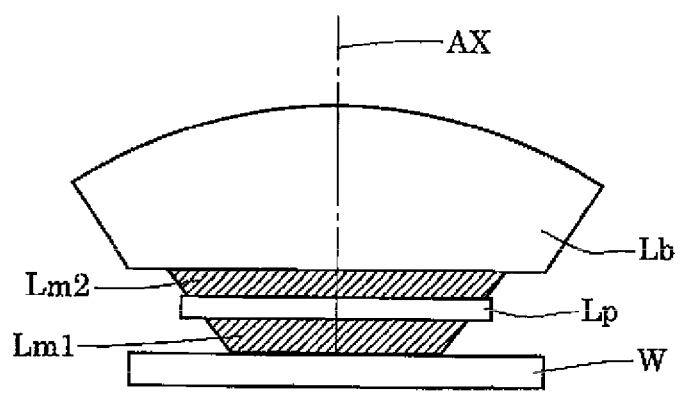
FIG. 3 is a schematic diagram showing the structure of an interface lens and a wafer in examples of the present invention.

FIG. 3 is a schematic diagram showing the structure of an interface lens and a wafer in examples of the present embodiment. As shown in FIG. 3, an immersed plane parallel plate Lp is arranged nearest to the wafer W in the projection optical system PL in each example of the present embodiment. One surface of the immersed plane parallel plate Lp nearer to the reticle R (object side surface) is in contact with a second liquid Lm2, and another surface of the immersed plane parallel plate Lp nearer to the wafer W (image side surface) is in contact with a first liquid Lm1. An interface lens Lb is arranged adjacent to the immersed plane parallel plate Lp. One surface of the interface lens Lb nearer to the retile R (reticle side surface) is in contact with gas, and another surface of the interface lens Lb nearer to the wafer W (wafer side surface) is in contact with the second liquid Lm2.

The projection optical system PL of each example of the present invention uses, for example, pure water (deionized water) as the first liquid Lm1 and the second liquid Lm2, which have a reflective index greater than 1.1. Pure water is easily obtained in large amounts at, for example, a semiconductor manufacturing factory. The projection optical system PL of each example uses, as the interface lens Lb, a positive lens that has a convex surface at the reticle side and a planar surface as the wafer side. The interface lens Lb and the immersed plane parallel plate Lp are both made of silica. Silica is selected as the material for the interface lens Lb and the immersed plane parallel plate Lp because the projection optical system PL may fail to maintain stable imaging performance when, for example, the interface lens Lb and/or the immersed plane parallel plate Lp are made of fluorite, which is soluble in water.

Further, the internal refractive index distribution of fluorite is known to contain a high-frequency element. The uneven refractive indexes of fluorite including the high-frequency element may cause flares. This may easily lower the imaging performance of the projection optical system. Moreover, fluorite is known to have natural birefringence. The natural birefringence effect of fluorite needs to be corrected to achieve high imaging performance of the projection optical system. The solubility, high-frequency element in the refractive index distribution, and natural birefringence make fluorite unsuitable for the material for the interface lens Lb and the immersed plane parallel plate Lp. It is preferable that the interface lens Lb and the immersed plane parallel plate Lp be made of silica.

The exposure apparatus that performs scanning and exposure while moving the wafer W relative to the projection optical system PL with the step-and-scan method needs to continuously fill the optical path between the interface lens Lb and the wafer W of the projection optical system PL with the liquid (Lm1 and Lm2) from the start to the end of the scanning and exposure process. To enable this, the exposure apparatus may use a technique described for example in International Patent Publication No. WO99/49504 or a technique described for example in Japanese Laid-Open Patent Publication No. 10-303114.

According to the technique described in International Patent Publication No. WO99/49504, a liquid supply apparatus supplies liquid, which has been adjusted to a predetermined temperature, to fill the optical path between the interface lens Lb and the wafer W through a supply pipe and an ejection nozzle, and then recovers the liquid on the wafer W through a recovery pipe and a suction nozzle. According to the technique described in Japanese Laid-Open Patent Publication No. 10-303114, a wafer holder table functions as a container for accommodating liquid. The wafer W is positioned and supported at the center of an inner bottom surface of the wafer holder table (immersed in the liquid) by vacuum contact. A distal end of a barrel of the projection optical system PL is immersed in the liquid. A wafer-side optical surface of the interface lens Lb is immersed in the liquid.

As shown in FIG. 1, the projection optical system PL of the present embodiment uses a first supply and discharge mechanism 21 to circulate pure water, which functions as the first liquid Lm1, in the optical path between the immersed plane parallel plate Lp and the wafer W. The projection optical system PL also uses a second supply and discharge mechanism 22 to circulate pure water, which functions as the second liquid Lm2, in the optical path between the interface lens Lb and the immersed plane parallel plate Lp. In this manner, the projection optical system PL circulates a small amount of pure water as the immersion liquid to prevent corrosion or fungal deterioration of the liquid.

In the examples of the present invention, an aspherical surface can be written as expression (a) shown below. In expression (a), y represents the height in the direction vertical to the optical axis, z represents the distance (sag amount) between a contact planar surface at the vertex of the aspherical surface and the position at the height y on the aspherical surface, r represents the curvature radius of the vertex, k represents the coefficient of the cone, and $C_n$ represents the n-th degree aspherical coefficient. In tables 1 and 2, which are shown below, the surface number of each aspherical lens surface is marked with *.

$$z=(y^2/r)/[1+\{1-(1+k)*y^2/r^2\}^{1/2}]+C_4*y^4+C_6*y^6+C_8*y^8+C_{10}*y^{10}+C_{12}*y^{12}+C_{14}*y^{14}+ \quad \text{Expression (a)}$$

The projection optical system PL of each example of the present embodiment includes a first imaging optical system G1, a second imaging optical system G2, and a third imaging optical system G3. The first imaging optical system G1 forms a first intermediate image of a pattern of the reticle R, which is arranged on an object plane (first plane) of the projection optical system PL. The second imaging optical system G2 forms a second intermediate image (which is an image of the first intermediate image as well as a secondary image of the reticle pattern) of the reticle pattern based on the light from the first intermediate image. The third imaging optical system G3 forms a final image (which is a reduced image of the reticle pattern) on the wafer W, which is arranged on an image plane (second plane) of the projection optical system PL, based on light from the second intermediate image. The first imaging optical system G1 and the third imaging optical system G3 are both refractive optical systems. The second imaging optical system G2 is a catadioptric optical system that includes a concave reflective mirror CM.

A first planar reflective mirror (first folding mirror) M1 is arranged in an optical path formed between the first imaging optical system G1 and the second imaging optical system G2. A second planar reflective mirror (second folding mirror) M2 is arranged in an optical path formed between the second imaging optical system G2 and the third imaging optical system G3. In the projection optical system PL of each example of the present invention, light from the reticle R passes through the first imaging optical system G1 and forms a first intermediate image of the reticle pattern in the vicinity of the first planar reflective mirror M1. Light from the first intermediate image then passes through the second imaging optical system G2 and forms a second intermediate image of the reticle pattern in the vicinity of the second planar reflective mirror M2. Finally, light from the second intermediate image passes through the third imaging optical system G3, and forms a final image of the reticle pattern on the wafer W.

In the projection optical system PL of each example of the present invention, the first imaging optical system G1 has an optical axis AX1 and the third imaging optical system G3 has an optical axis AX3. The optical axes AX1 and AX3 extend linearly in the vertical direction. The optical axes AX1 and AX3 coincide with the reference optical axis AX. The second imaging optical system G2 has an optical axis AX2 that extends linearly along the horizontal direction (vertical to the reference optical axis AX). The reticle R, the wafer W, all the optical members forming the first imaging optical system G1, and all the optical members forming the third imaging optical system G3 are arranged parallel to one another along planes perpendicular to the direction of gravitational force, that is, along horizontal planes. Further, the first planar reflective mirror M1 and the second planar reflective mirror M2 have reflective surfaces that each form an angle of 45 degrees with the reticle surface. The first planar reflective mirror M1 and the second planar reflective mirror M2 are formed integrally as a single optical member. Further, the projection optical system PL of each example of the present invention is formed to be substantially telecentric at both of the object side and the image side.

First Example

Figure 4:
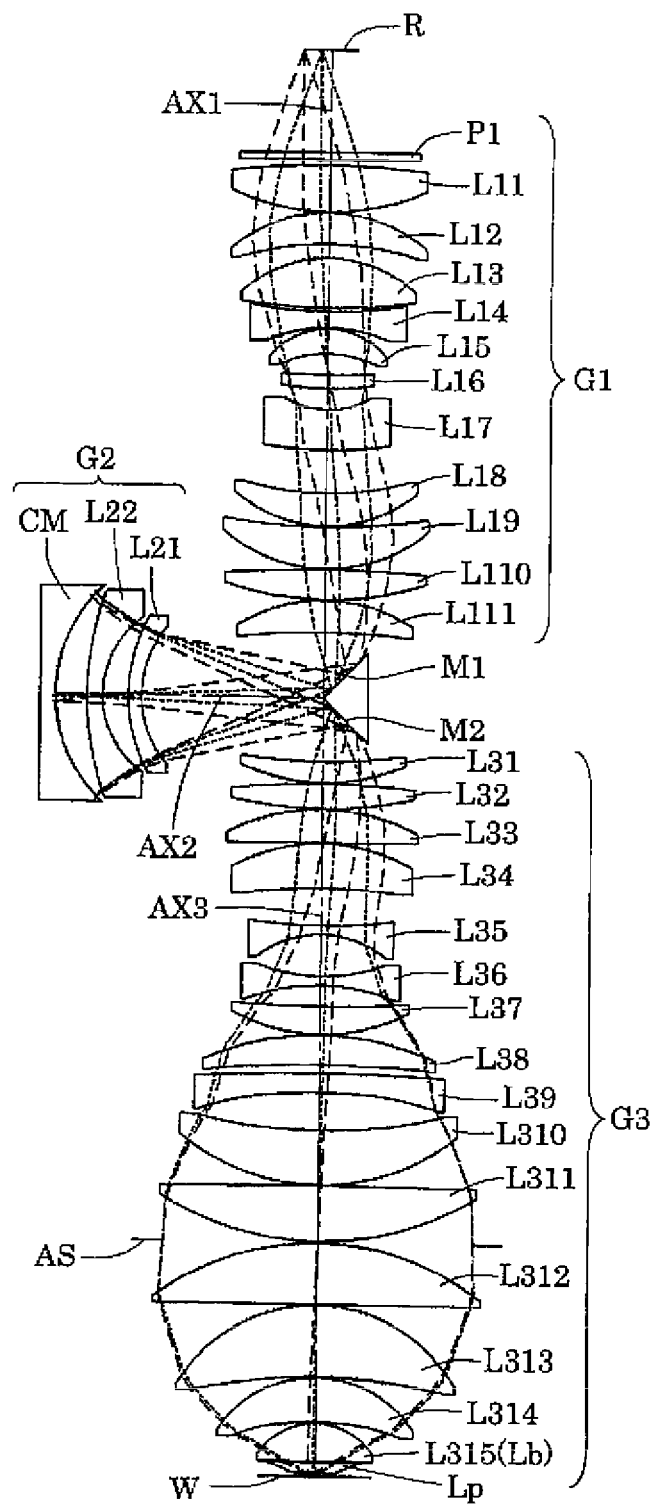
FIG. 4 shows a lens structure of a projection optical system in a first example of the present invention.

FIG. 4 shows a lens structure of a projection optical system according to a first example of the present embodiment. As shown in FIG. 4, the first imaging optical system G1 included in the projection optical system PL of the first example includes a plane parallel plate P1, a biconvex lens L11, a positive meniscus lens L12 having a convex surface at its reticle side, a biconvex lens L13, a biconcave lens L14 having an aspherical concave surface at its reticle side, a positive meniscus lens L15 having a convex surface at its reticle side, a positive meniscus lens L16 having a concave surface at its reticle side, a negative meniscus lens L17 having a concave surface at its reticle side, a positive meniscus lens L18 having an aspherical concave surface at its reticle side, a positive meniscus lens L19 having a concave surface at its reticle side, a biconvex lens L110, and a positive meniscus lens L111 having an aspherical concave surface at its wafer side, which are arranged sequentially in this order from the reticle side.

The second imaging optical system G2 includes a negative meniscus lens L21 having a concave surface at its reticle side, a negative meniscus lens L22 having a concave surface at its reticle side, and a concave reflective mirror CM having a concave surface at its reticle side, which are arranged sequentially in this order along the traveling path of the incoming light from the reticle side (light entering side) of the projection optical system PL. The third imaging optical system G3 includes a positive meniscus lens L31 having a concave surface at its reticle side, a biconvex lens L32, a positive meniscus lens L33 having a convex surface at its reticle side, a positive meniscus lens L34 having a spherical concave surface at its wafer side, a biconcave lens L35, a biconcave lens L36 having an aspherical concave surface at its wafer side, a positive meniscus lens L37 having an aspherical concave surface at its reticle side, a positive meniscus lens L38 having an aspherical concave surface at its wafer side, a negative meniscus lens L39 having an aspherical concave surface at its wafer side, a positive meniscus lens L310 having an aspherical concave surface at its reticle side, a biconvex lens L311, an aperture stop AS, a plano-convex lens L312 having a planar surface at its wafer side, a positive meniscus lens L313 having an aspherical concave surface at its wafer side, a positive meniscus lens S314 having an aspherical concave surface at its wafer side, a plano-convex lens L315 (interface lens Lb) having a planar surface at its wafer side, and a plane parallel plate Lp, which are arranged sequentially in this order from the reticle side (light entering side).

In the projection optical system PL of the first example, an optical path between the interface lens Lb and the plane parallel plate (immersed plane parallel plate) Lp and an optical path between the plane parallel plate Lp and the wafer W are filled with pure water (Lm1 and Lm2) having a refractive index of 1.435876 for an ArF excimer laser beam (having a central wavelength λ of 193.306 nm), which is the used light (exposure beam). All the light transmitting members including the interface lens Lb and the plane parallel plate Lp are made of silica (SiO$_2$), which has a refractive index of 1.5603261 relative to the central wavelength of the used light.

Table 1 below shows the specifications of the projection optical system PL in the first example. In Table 1, λ represents the central wavelength of the exposure beam, β represents the projection magnification (imaging ratio of the entire system), NA represents the numerical aperture at the image side (wafer side) of the system, B represents the radius of the image circle IF on the wafer W, A represents the off-axis amount of the effective exposure region ER, LX represents the size of the effective exposure region ER in the X-axis direction (the long-side dimension of the effective exposure region ER), and LY represents the dimension of the effective exposure region ER in the Y-axis direction (the short-side dimension of the effective exposure region ER).

In the table, the surface number represents the order of each surface on the path of the light traveling from the reticle surface, which is the object surface (first plane), to the wafer surface, which is the image surface (second plane), r represents the curvature radius of each surface (the curvature radius (mm) of the vertex in the case of an aspherical surface), d represents the axial interval of each surface or the surface interval (mm), and n represents the refractive index about the central wavelength of the exposure beam. The sign of the surface interval d is inverted whenever the light is reflected. Accordingly, the surface interval d has a negative sign for the optical path from the reflective surface of the first planar reflective mirror M1 to the concave reflective mirror CM and for the optical path from the second planar reflective mirror M2 to the image surface, whereas the surface interval d has a positive sign for other optical paths.

In the first imaging optical system G1, the curvature radius is positive for convex surfaces facing toward the reticle side, and the curvature radius is negative for concave surfaces facing toward the reticle side. In the second imaging optical system G2, the curvature radius is positive for concave surfaces facing toward the light entering side (reticle side) of the incoming light, and the curvature radius is negative for convex surfaces facing toward the light entering side. The notations used in Table 1 are used in Table 2, which will be described later.

TABLE 1

(Main Specifications)

λ = 193.306 nm
β = ¼
NA = 1.32
B = 15.3 mm
A = 2.8 mm
LX = 26 mm
LY = 5 mm (Specifications of Optical Members)

| Surface No. | r | d | n | Optical Member |
|---|---|---|---|---|
| | (Reticle Surface) | 113.7542 | | |
| 1 | ∞ | 8.0000 | 1.5603261 | (P1) |
| 2 | ∞ | 6.0000 | | |
| 3 | 961.49971 | 52.0000 | 1.5603261 | (L11) |
| 4 | −260.97642 | 1.0000 | | |
| 5 | 165.65618 | 35.7731 | 1.5603261 | (L12) |
| 6 | 329.41285 | 15.7479 | | |
| 7 | 144.73700 | 56.4880 | 1.5603261 | (L13) |
| 8 | −651.17229 | 4.1450 | | |
| 9* | −678.61021 | 18.2979 | 1.5603261 | (L14) |
| 10 | 173.73534 | 1.0000 | | |
| 11 | 82.85141 | 28.4319 | 1.5603261 | (L15) |
| 12 | 122.17403 | 24.6508 | | |
| 13 | −632.23083 | 15.8135 | 1.5603261 | (L16) |
| 14 | −283.76586 | 22.9854 | | |
| 15 | −95.83749 | 44.8780 | 1.5603261 | (L17) |
| 16 | −480.25701 | 49.9532 | | |
| 17* | −327.24655 | 37.6724 | 1.5603261 | (L18) |
| 18 | −152.74838 | 1.0000 | | |
| 19 | −645.51205 | 47.0083 | 1.5603261 | (L19) |
| 20 | −172.70890 | 1.0000 | | |
| 21 | 1482.42136 | 32.7478 | 1.5603261 | (L110) |
| 22 | −361.68453 | 1.0000 | | |
| 23 | 185.06735 | 36.2895 | 1.5603261 | (L111) |
| 24* | 1499.92500 | 72.0000 | | |
| 25 | ∞ | −204.3065 | | (M1) |
| 26 | 115.50235 | −15.0000 | 1.5603261 | (L21) |
| 27 | 181.35110 | −28.1819 | | |
| 28 | 107.57500 | −18.0000 | 1.5603261 | (L22) |
| 29 | 327.79447 | −34.9832 | | |
| 30 | 165.18700 | 34.9832 | | (CM) |
| 31 | 327.79446 | 18.0000 | 1.5603261 | (L22) |
| 32 | 107.57500 | 28.1819 | | |
| 33 | 181.35110 | 15.0000 | 1.5603261 | (L21) |
| 34 | 115.50235 | 204.3065 | | |
| 35 | ∞ | −72.0000 | | (M2) |
| 36 | 552.89298 | −24.4934 | 1.5603261 | (L31) |
| 37 | 211.40931 | −1.0000 | | |
| 38 | −964.15750 | −27.5799 | 1.5603261 | (L32) |
| 39 | 451.41200 | −1.0000 | | |
| 40 | −239.74429 | −35.7714 | 1.5603261 | (L33) |
| 41 | −171769.23040 | −1.0000 | | |
| 42 | −206.94777 | −50.0000 | 1.5603261 | (L34) |
| 43* | −698.47035 | −43.1987 | | |
| 44 | 560.33453 | −10.0000 | 1.5603261 | (L35) |
| 45 | −116.92245 | −46.5360 | | |
| 46 | 209.32811 | −10.0000 | 1.5603261 | (L36) |
| 47* | −189.99848 | −23.6644 | | |
| 48* | 1878.63986 | −31.5066 | 1.5603261 | (L37) |
| 49 | 211.85278 | −1.0000 | | |
| 50 | −322.20466 | −33.1856 | 1.5603261 | (L38) |
| 51* | −1160.22740 | −10.0172 | | |
| 52 | −2715.10365 | −22.0000 | 1.5603261 | (L39) |
| 53* | −959.87714 | −42.0799 | | |
| 54* | 727.37853 | −62.0255 | 1.5603261 | (L310) |
| 55 | 240.59248 | −1.0000 | | |
| 56 | −16276.86134 | −62.1328 | 1.5603261 | (L311) |
| 57 | 333.64919 | −1.0000 | | |
| 58 | ∞ | −1.0000 | | (AS) |
| 59 | −303.09919 | −68.2244 | 1.5603261 | (L312) |
| 60 | ∞ | −1.0000 | | |
| 61 | −182.25869 | −77.6122 | 1.5603261 | (L313) |
| 62* | −472.72383 | −1.0000 | | |
| 63 | −131.14200 | −49.9999 | 1.5603261 | (L314) |
| 64* | −414.78286 | −1.0000 | | |

TABLE 1-continued

| | | | |
|---|---|---|---|
| 65 | −75.90800 | −43.3351 | 1.5603261 (L315: Lb) |
| 66 | ∞ | −1.0000 | 1.435876 (Lm2) |
| 67 | ∞ | −13.0000 | 1.5603261 (Lp) |
| 68 | ∞ | −2.9999 | 1.435876 (Lm1) |
| (Wafer Surface) | | | |

(Aspherical Surface Data)

Figure 5:
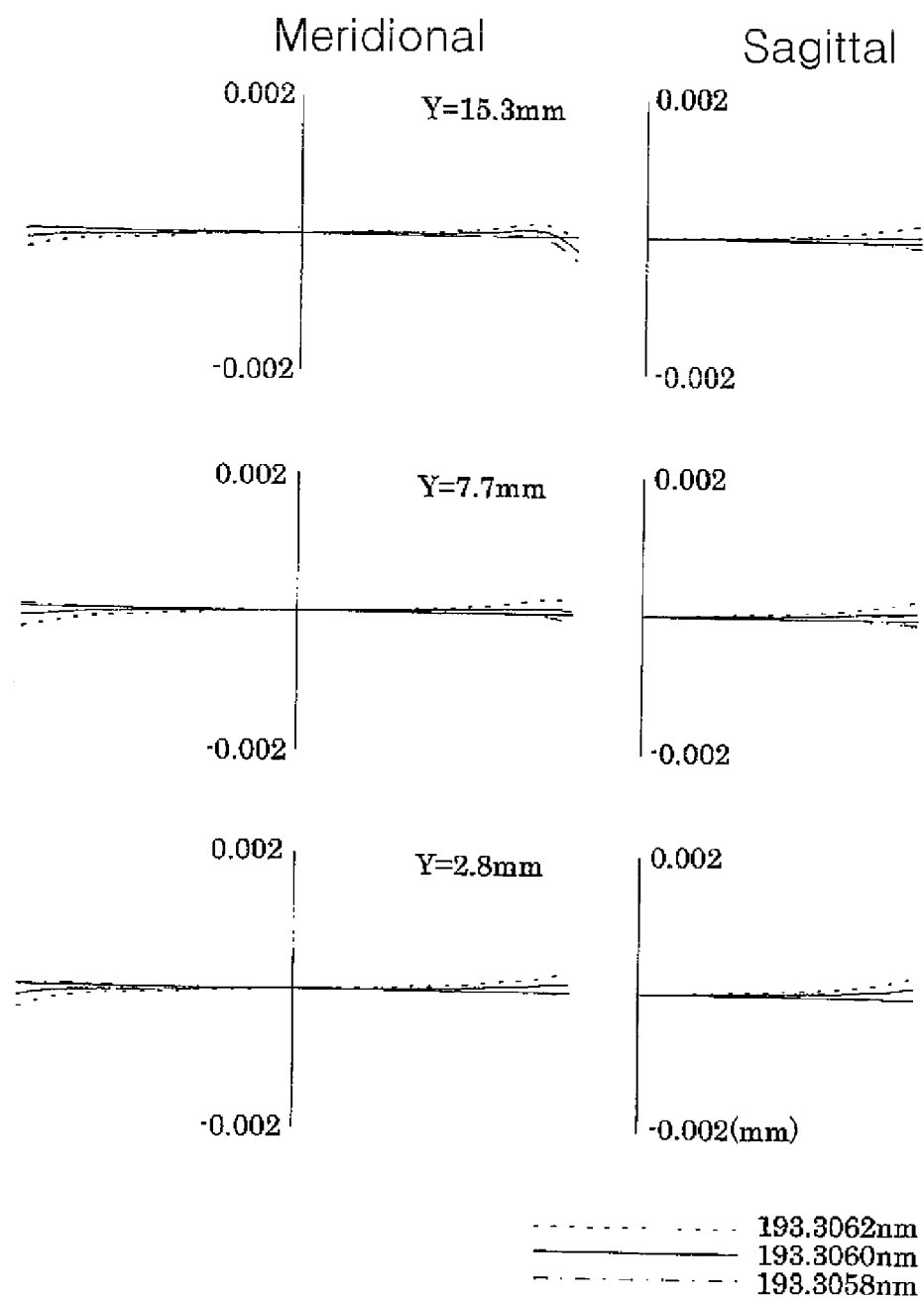
FIG. 5 shows lateral aberration occurring in the projection optical system in the first example of the present invention.

9th surface $\kappa = 0$
$C_4 = -7.9031*10^{-8}$   $C_6 = 8.6709*10^{-12}$
$C_8 = -6.5472*10^{-16}$   $C_{10} = 1.5504*10^{-20}$
$C_{12} = 2.6800*10^{-24}$   $C_{14} = -2.6032*10^{-28}$
$C_{16} = 7.3308*10^{-33}$   $C_{18} = 0$ 17th surface $\kappa = 0$
$C_4 = 4.7672*10^{-9}$   $C_6 = -8.7145*10^{-13}$
$C_8 = -2.8591*10^{-17}$   $C_{10} = 3.9981*10^{-21}$
$C_{12} = -1.9927*10^{-25}$   $C_{14} = 2.8410*10^{-30}$
$C_{16} = 6.5538*10^{-35}$   $C_{18} = 0$ 24th surface $\kappa = 0$
$C_4 = 2.7118*10^{-8}$   $C_6 = -4.0362*10^{-13}$
$C_8 = 8.5346*10^{-18}$   $C_{10} = -1.7653*10^{-22}$
$C_{12} = -1.1856*10^{-27}$   $C_{14} = 5.2597*10^{-31}$
$C_{16} = -2.0897*10^{-35}$   $C_{18} = 0$ 43rd surface $\kappa = 0$
$C_4 = -1.8839*10^{-8}$   $C_6 = 5.6009*10^{-13}$
$C_8 = -1.8306*10^{-17}$   $C_{10} = 2.2177*10^{-21}$
$C_{12} = -2.3512*10^{-25}$   $C_{14} = 1.7766*10^{-29}$
$C_{16} = -6.5390*10^{-34}$   $C_{18} = 0$ 47th surface $\kappa = 0$
$C_4 = 9.0773*10^{-8}$   $C_6 = -5.4651*10^{-12}$
$C_8 = 4.4000*10^{-16}$   $C_{10} = -2.7426*10^{-20}$
$C_{12} = 3.2149*10^{-25}$   $C_{14} = 2.3641*10^{-28}$
$C_{16} = -1.3953*10^{-32}$   $C_{18} = 0$ 48th surface $\kappa = 0$
$C_4 = 3.0443*10^{-8}$   $C_6 = -1.6528*10^{-12}$
$C_8 = 2.3949*10^{-17}$   $C_{10} = -4.4953*10^{-21}$
$C_{12} = 3.0165*10^{-25}$   $C_{14} = -1.2463*10^{-28}$
$C_{16} = 1.0783*10^{-32}$   $C_{18} = 0$ 51st surface $\kappa = 0$
$C_4 = 1.8357*10^{-8}$   $C_6 = -4.3103*10^{-13}$
$C_8 = -9.4499*10^{-17}$   $C_{10} = 4.3247*10^{-21}$
$C_{12} = -1.6979*10^{-25}$   $C_{14} = 8.6892*10^{-30}$
$C_{16} = -1.5935*10^{-34}$   $C_{18} = 0$ 53rd surface $\kappa = 0$
$C_4 = -3.9000*10^{-8}$   $C_6 = -7.2737*10^{-13}$
$C_8 = 1.1921*10^{-16}$   $C_{10} = -2.6393*10^{-21}$
$C_{12} = -3.1544*10^{-26}$   $C_{14} = 1.8774*10^{-30}$
$C_{16} = -2.3545*10^{-35}$   $C_{18} = 0$ 54th surface $\kappa = 0$
$C_4 = 1.9116*10^{-8}$   $C_6 = -6.7783*10^{-13}$
$C_8 = 1.5688*10^{-17}$   $C_{10} = -6.0850*10^{-22}$
$C_{12} = 1.8575*10^{-26}$   $C_{14} = -4.2147*10^{-31}$
$C_{16} = 7.3240*10^{-36}$   $C_{18} = 0$ 62nd surface $\kappa = 0$
$C_4 = 3.0649*10^{-8}$   $C_6 = -2.3613*10^{-12}$
$C_8 = 1.5604*10^{-16}$   $C_{10} = -7.3591*10^{-21}$
$C_{12} = 2.1593*10^{-25}$   $C_{14} = -3.5918*10^{-30}$
$C_{16} = 2.5879*10^{-35}$   $C_{18} = 0$ TABLE 1-continued 64th surface $\kappa = 0$
$C_4 = -6.0849*10^{-8}$   $C_6 = -8.7021*10^{-13}$
$C_8 = -1.5623*10^{-16}$   $C_{10} = 1.5681*10^{-20}$
$C_{12} = -1.6989*10^{-24}$   $C_{14} = 7.9711*10^{-29}$
$C_{16} = -2.7075*10^{-33}$   $C_{18} = 0$ FIG. 5 shows lateral aberrations in the projection optical system PL of the first example. In the aberration charts, Y represents the image height, the solid line represents lateral aberration occurring when the exposure beam has a central wavelength of 193.3060 nm, the broken line represents lateral aberration occurring when the exposure beam has a central wavelength of 193.306 nm+0.2 pm=193.3062 nm, the single-dash line represents lateral aberration occurring when the exposure beam has a central wavelength of 193.306 nm−0.2 pm=193.3058 nm. The notations used in FIG. 5 are used in FIG. 7, which will be described later. As apparent from FIG. 5, the aberration is corrected in a satisfactory manner for the exposure beams with a wavelength width of 193.306 nm±0.2 pm although the projection optical system PL has an extremely large image-side numerical aperture (NA=1.32) and a relatively large effective exposure region ER (26 mm by 5 mm).

Second Example

Figure 6:
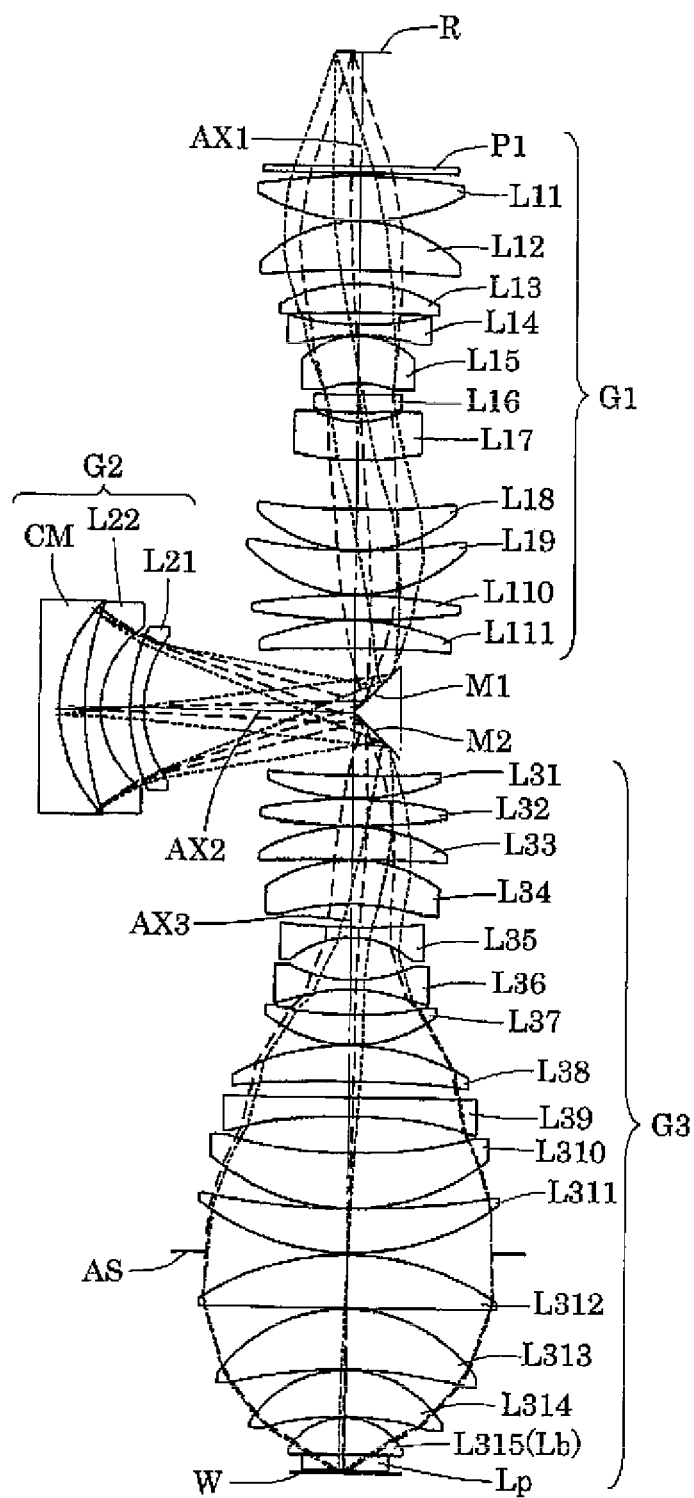
FIG. 6 shows a lens structure of a projection optical system in a second example of the present invention.

FIG. 6 shows a lens structure for a projection optical system according to a second example of the present embodiment. As shown in FIG. 6, the first imaging optical system G1 in the projection optical system PL of the second example includes a plane parallel plate P1, a biconvex lens L11, a positive meniscus lens L12 having a convex surface at its reticle side, a positive meniscus lens L13 having a convex surface at its reticle side, a biconcave lens L14 having an aspherical concave surface at its reticle side, a positive meniscus lens L15 having a convex surface at its reticle side, a positive meniscus lens L16 having a concave surface at its reticle side, a negative meniscus lens L17 having a concave surface at its reticle side, a positive meniscus lens L18 having an aspherical concave surface at its reticle side, a positive meniscus lens L19 having a concave surface at its reticle side, a biconcave lens L110, and a positive meniscus lens L111 having an aspherical concave surface at its wafer side, which are arranged sequentially in this order from the reticle side.

The second imaging optical system G2 includes a negative meniscus lens L21 having a concave surface at its reticle side, a negative meniscus lens L22 having a concave surface at its reticle side, and a concave reflective mirror CM having a concave surface at its reticle side, which are arranged sequentially in this order along a traveling path of the incoming light from the reticle side (light entering side) of the projection optical system PL. A third imaging optical system G3 includes a positive meniscus lens L31 having a concave surface at its reticle side, a biconvex lens L32, a positive meniscus lens L33 having a convex surface at its reticle side, a positive meniscus lens L34 having an aspherical concave surface at its wafer side, a biconcave lens L35, a biconcave lens L36 having a aspherical concave surface at its wafer side, a positive meniscus lens L37 having an aspherical concave surface at its reticle side, a positive meniscus lens L38 having an aspherical concave surface at its wafer side, a plano-concave lens L39 having an aspherical concave surface at its wafer side, a positive meniscus lens L310 having an aspherical concave surface at its reticle side, a positive meniscus lens L311 having a concave surface at its reticle side, an aperture stop AS, a plano-convex lens L312 having a planar surface at its wafer side, a positive meniscus lens L313 having an aspherical concave surface at its wafer side, a positive meniscus lens S314 having an aspherical concave surface at its wafer side, a plano-convex lens L315 (interface lens Lb) having a planar surface at its wafer side, and a plane parallel plate Lp, which are arranged sequentially in this order from the reticle side (light entering side).

In the same manner as in the first example, in the second example, an optical path between the interface lens Lb and the plane parallel plate (immersed plane parallel plate) Lp and an optical path between the plane parallel plate Lp and the wafer W are filled with pure water (Lm1 and Lm2) having a refractive index of 1.435876 relative to an ArF excimer laser beam (having a central wavelength λ of 193.306 nm), which is the used laser beam (exposure beam). All the light transmitting members including the interface lens Lb and the plane parallel plate Lp are made of silica ($SiO_2$), which has a refractive index of 1.5603261 relative to the central wavelength of the used light. Table 2 below shows the specifications of the projection optical system PL according to the second example.

TABLE 2

(Main Specifications)

λ = 193.306 nm
β = ¼
NA = 1.3
B = 15.4 mm
A = 3 mm
LX = 26 mm
LY = 5 mm (Specifications of Optical Members)

| Surface No. | r | d | n | Optical Member |
|---|---|---|---|---|
|  | (Reticle Surface) | 128.0298 |  |  |
| 1 | ∞ | 8.0000 | 1.5603261 | (P1) |
| 2 | ∞ | 3.0000 |  |  |
| 3 | 708.58305 | 50.0000 | 1.5603261 | (L11) |
| 4 | −240.96139 | 1.0000 |  |  |
| 5 | 159.28256 | 55.0000 | 1.5603261 | (L12) |
| 6 | 1030.42583 | 15.3309 |  |  |
| 7 | 175.91680 | 33.4262 | 1.5603261 | (L13) |
| 8 | 1901.42936 | 13.4484 |  |  |
| 9* | −313.76486 | 11.8808 | 1.5603261 | (L14) |
| 10 | 235.56199 | 1.0000 |  |  |
| 11 | 90.40801 | 53.3442 | 1.5603261 | (L15) |
| 12 | 109.36394 | 12.8872 |  |  |
| 13 | −1337.13410 | 20.2385 | 1.5603261 | (L16) |
| 14 | −314.47144 | 10.2263 |  |  |
| 15 | −106.13528 | 42.5002 | 1.5603261 | (L17) |
| 16 | −334.97792 | 56.0608 |  |  |
| 17* | −1619.43320 | 46.3634 | 1.5603261 | (L18) |
| 18 | −167.00000 | 1.0000 |  |  |
| 19 | −568.04127 | 48.4966 | 1.5603261 | (L19) |
| 20 | −172.67366 | 1.0000 |  |  |
| 21 | 637.03167 | 27.8478 | 1.5603261 | (L110) |
| 22 | −838.93167 | 1.0000 |  |  |
| 23 | 264.56403 | 30.7549 | 1.5603261 | (L111) |
| 24* | 3443.52617 | 72.0000 |  |  |
| 25 | ∞ | −237.1956 |  | (M1) |
| 26 | 134.07939 | −15.0000 | 1.5603261 | (L21) |
| 27 | 218.66017 | −33.2263 |  |  |
| 28 | 111.51192 | −18.0000 | 1.5603261 | (L22) |
| 29 | 334.92606 | −28.5215 |  |  |
| 30 | 170.92067 | 28.5215 |  | (CM) |
| 31 | 334.92606 | 18.0000 | 1.5603261 | (L22) |
| 32 | 111.51192 | 33.2263 |  |  |
| 33 | 218.66017 | 15.0000 | 1.5603261 | (L21) |
| 34 | 134.07939 | 237.1956 |  |  |

TABLE 2-continued

| 35 | ∞ | −72.0000 |  | (M2) |
|---|---|---|---|---|
| 36 | 1133.17643 | −25.2553 | 1.5603261 | (L31) |
| 37 | 247.47802 | −1.0000 |  |  |
| 38 | −480.60890 | −29.6988 | 1.5603261 | (L32) |
| 39 | 626.43077 | −1.0000 |  |  |
| 40 | −208.29831 | −36.2604 | 1.5603261 | (L33) |
| 41 | −2556.24930 | −1.0000 |  |  |
| 42 | −173.46230 | −50.0000 | 1.5603261 | (L34) |
| 43* | −294.18687 | −26.4318 |  |  |
| 44 | 699.54032 | −11.5000 | 1.5603261 | (L35) |
| 45 | −106.38847 | −47.9520 |  |  |
| 46 | 158.19938 | −11.5000 | 1.5603261 | (L36) |
| 47* | −189.99848 | −27.6024 |  |  |
| 48* | 487.32943 | −34.3282 | 1.5603261 | (L37) |
| 49 | 153.21216 | −1.0000 |  |  |
| 50 | −280.33475 | −39.4036 | 1.5603261 | (L38) |
| 51* | −1666.66667 | −17.3862 |  |  |
| 52 | ∞ | −22.0000 | 1.5603261 | (L39) |
| 53* | −1511.71580 | −40.3150 |  |  |
| 54* | 655.86673 | −62.2198 | 1.5603261 | (L310) |
| 55 | 242.88510 | −1.0000 |  |  |
| 56 | 843.73059 | −49.2538 | 1.5603261 | (L311) |
| 57 | 280.00000 | −1.0000 |  |  |
| 58 | ∞ | −1.0000 |  | (AS) |
| 59 | −291.92686 | −61.1038 | 1.5603261 | (L312) |
| 60 | ∞ | −1.0000 |  |  |
| 61 | −179.32463 | −67.4474 | 1.5603261 | (L313) |
| 62* | −438.34656 | −1.0000 |  |  |
| 63 | −128.42402 | −52.4156 | 1.5603261 | (L314) |
| 64* | −401.88080 | −1.0000 |  |  |
| 65 | −75.86112 | −41.5893 | 1.5603261 | (L315: Lb) |
| 66 | ∞ | −1.0000 | 1.435876 | (Lm2) |
| 67 | ∞ | −16.5000 | 1.5603261 | (Lp) |
| 68 | ∞ | −3.0000 | 1.435876 | (Lm1) |
|  | (Wafer Surface) |  |  |  |

(Aspherical Surface Data)

Figure 7:
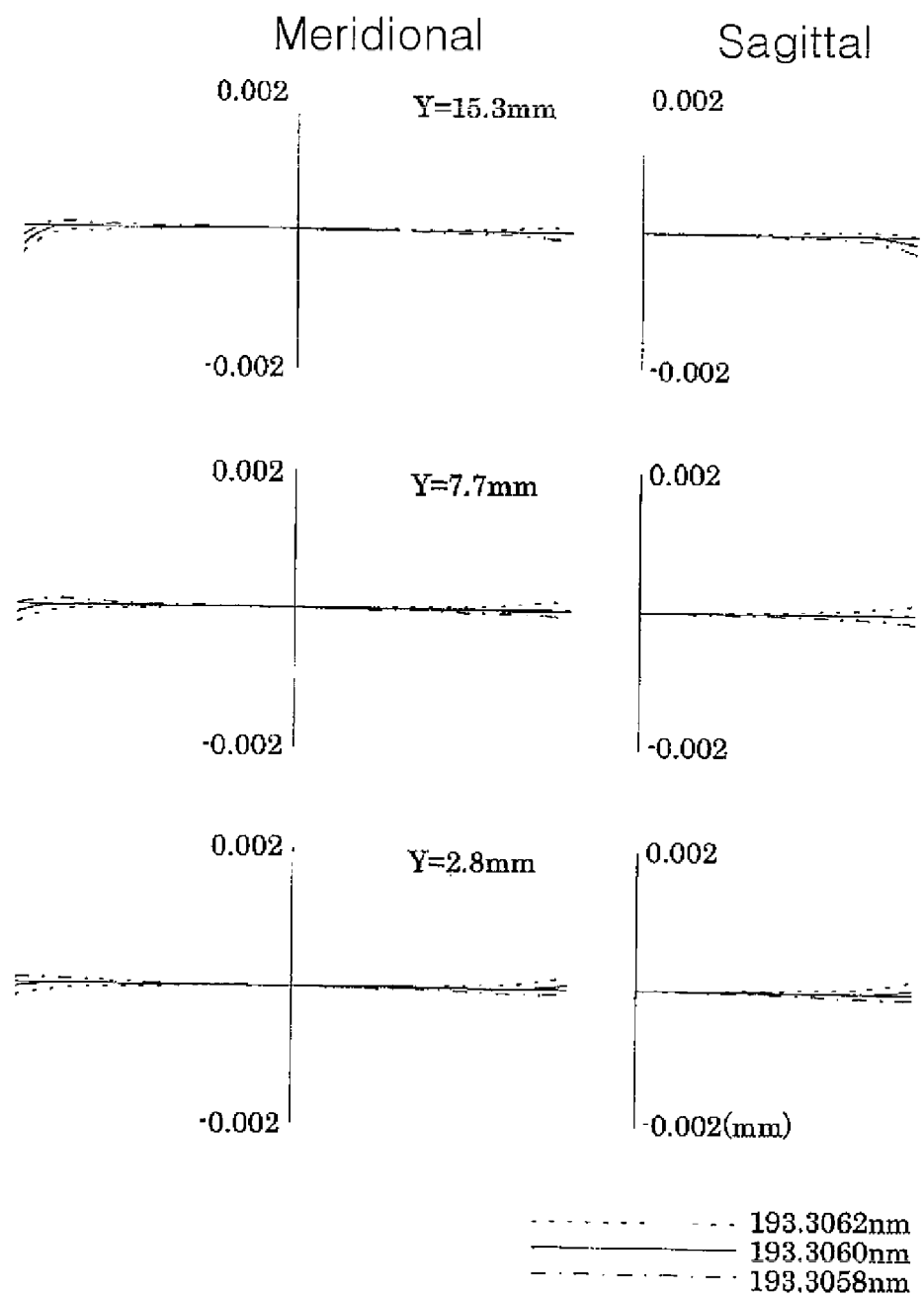
FIG. 7 shows lateral aberration occurring in the projection optical system in the second example of the present invention.

9th surface $\kappa = 0$
$C_4 = -3.1753*10^{-8}$      $C_6 = 9.0461*10^{-12}$
$C_8 = -1.0355*10^{-15}$     $C_{10} = 1.2398*10^{-19}$
$C_{12} = -1.1221*10^{-23}$  $C_{14} = 5.7476*10^{-28}$
$C_{16} = -1.1800*10^{-32}$  $C_{18} = 0$ 17th surface $\kappa = 0$
$C_4 = -2.8399*10^{-8}$      $C_6 = -3.0401*10^{-13}$
$C_8 = 1.1462*10^{-17}$      $C_{10} = 4.0639*10^{-22}$
$C_{12} = -8.6125*10^{-26}$  $C_{14} = 4.4202*10^{-30}$
$C_{16} = -9.9158*10^{-35}$  $C_{18} = 0$ 24th surface $\kappa = 0$
$C_4 = 2.1499*10^{-8}$       $C_6 = -3.8861*10^{-13}$
$C_8 = 5.4812*10^{-18}$      $C_{10} = -2.1623*10^{-23}$
$C_{12} = -2.5636*10^{-26}$  $C_{14} = 2.1879*10^{-30}$
$C_{16} = -6.5039*10^{-35}$  $C_{18} = 0$ 43th surface $\kappa = 0$
$C_4 = -2.0533*10^{-8}$      $C_6 = 7.8051*10^{-13}$
$C_8 = 9.4002*10^{-18}$      $C_{10} = -2.1043*10^{-21}$
$C_{12} = 7.8182*10^{-25}$   $C_{14} = -9.2007*10^{-29}$
$C_{16} = 3.6742*10^{-33}$   $C_{18} = 0$ 47th surface $\kappa = 0$
$C_4 = 9.8639*10^{-8}$       $C_6 = -6.7359*10^{-12}$
$C_8 = 6.8579*10^{-16}$      $C_{10} = -6.1604*10^{-20}$
$C_{12} = 5.1722*10^{-24}$   $C_{14} = -2.9412*10^{-28}$
$C_{16} = 8.6688*10^{-33}$   $C_{18} = 0$ 48th surface $\kappa = 0$
$C_4 = 4.3101*10^{-8}$       $C_6 = -3.2805*10^{-12}$
$C_8 = 5.6432*10^{-17}$      $C_{10} = -9.2345*10^{-22}$
$C_{12} = 1.0713*10^{-25}$   $C_{14} = -9.9944*10^{-30}$
$C_{16} = 1.8148*10^{-33}$   $C_{18} = 0$ TABLE 2-continued 51th surface $\kappa = 0$
$C_4 = 2.5839*10^{-8}$
$C_8 = -4.9271*10^{-17}$
$C_{12} = -7.2550*10^{-26}$
$C_{16} = -2.4260*10^{-35}$
$C_6 = -1.8848*10^{-12}$
$C_{10} = 4.4946*10^{-21}$
$C_{14} = 4.9237*10^{-31}$
$C_{18} = 6.2565*10^{-40}$ 53th surface $\kappa = 0$
$C_4 = -4.7449*10^{-8}$
$C_8 = 1.0475*10^{-16}$
$C_{12} = -9.0530*10^{-26}$
$C_{16} = -6.4961*10^{-35}$
$C_6 = -2.3075*10^{-13}$
$C_{10} = -2.1805*10^{-21}$
$C_{14} = 4.6274*10^{-30}$
$C_{18} = 3.4402*10^{-41}$ 54th surface $\kappa = 0$
$C_4 = 2.0328*10^{-8}$
$C_8 = 1.6217*10^{-17}$
$C_{12} = 8.2634*10^{-27}$
$C_{16} = -2.0989*10^{-35}$
$C_6 = -7.7439*10^{-13}$
$C_{10} = -3.5531*10^{-22}$
$C_{14} = 2.6232*10^{-31}$
$C_{18} = 4.0888*10^{-40}$ 62th surface $\kappa = 0$
$C_4 = 2.5121*10^{-8}$
$C_8 = 1.2906*10^{-6}$
$C_{12} = 1.2885*10^{-25}$
$C_{16} = 3.2850*10^{-36}$
$C_6 = -2.0342*10^{-12}$
$C_{10} = -5.4455*10^{-21}$
$C_{14} = -1.4600*10^{-30}$
$C_{18} = 0$ 64th surface $\kappa = 0$
$C_4 = -2.8098*10^{-8}$
$C_8 = 3.1966*10^{-16}$
$C_{12} = 1.8266*10^{-24}$
$C_{16} = 2.1570*10^{-33}$
$C_6 = -3.9565*10^{-12}$
$C_{10} = -2.7246*10^{-20}$
$C_{14} = -8.6244*10^{-29}$
$C_{18} = 0$ FIG. 7 shows lateral aberrations occurring in the projection optical system PL of the second example. As apparent from FIG. 7, the aberration is corrected in an satisfactory manner for the exposure beams having a wavelength width of 193.306 nm±0.2 pm even though the projection optical system PL of the second example has an extremely large image-side numerical aperture (NA=1.3) and a relatively large effective exposure region ER (26 mm by 5 mm) in the same manner as in the projection optical system PL of the first example.

In this manner, the optical path formed between the interface lens Lb and the wafer W is filled with pure water (Lm1 and Lm2) having a large refractive index in the projection optical system PL of the present embodiment. This enables the projection optical system PL to have a relatively large effective imaging region while achieving a large effective image-side numerical aperture. The projection optical system PL of each example of the present invention has a rectangular effective exposure region (stationary exposure region) ER having the dimensions of 26 mm by 5 mm while achieving a high image-side numerical aperture of about 1.3 for an ArF excimer laser beam having a central wavelength of 193.306 nm. This enables the projection optical system PL of each example to scan and expose a circuit pattern within a rectangular exposure region of, for example, 26 mm by 33 mm with a high accuracy.

A shape error on any lens surface of the two-way optical elements (L21 and L22) in a catadioptric optical system affects local flares twice as much as a normal lens surface. Thus, in each of the above examples, aspherical surfaces are excluded from a two-way optical path in which twice as much local flares may occur with a single lens surface. That is, all of the two-way optical elements do not include optical surfaces with an aspherical shape. In each of the above examples, local flares are further reduced by eliminating crystalline material from the two-way optical path portions, through which light passes twice, that is, by using an amorphous material (silica in the present embodiment) to form all the two-way optical elements (L21 and L22) in the second imaging optical system G2. Further, a shape error occurring on the reflective surface of the concave reflection mirror in the second imaging optical system G2 also affects local flares twice as much as a shape error occurring on a lens surface on a one-way optical element. Thus, in each of the above examples, local flares are reduced by forming the concave reflection mirror CM to have a spherical reflective surface.

The immersion projection optical system PL of the present embodiment employs a catadioptric optical system structure. Thus, the projection optical system PL substantially satisfies Petzval's condition and ensures the flatness of an image although the projection optical system PL has a large image-side numerical aperture. The projection optical system PL also employs an off-axis optical system structure, in which an effective field of view region (effective illumination region) and an effective projection region (effective exposure region ER) do not extend on an optical axis of the projection optical system (the regions are "off" the optical axis). This projection optical system PL eliminates a light shielding portion in its lens aperture (pupil), and increases the variety of patterns of images that can be formed. However, the catadioptric and off-axis immersion projection optical system PL of the present embodiment will have problems when the light emitting surface of the immersed plane parallel plate Lp, which is a refractive optical element arranged nearest to the imaging position (to the wafer W), is formed rotationally symmetric with respect to the optical axis AX3 (or the reference optical axis AX) according to a conventional technique.

FIG. 8 is a diagram describing problems occurring when the light emitting surface of the refractive optical element arranged nearest to the imaging position is formed rotationally symmetric according to a conventional technique. As shown in FIG. 8, the light entering surface of the immersed plane parallel plate Lp, which is the refractive optical element arranged nearest to the imaging position (to the wafer W) in the immersion projection optical system PL, has a circumference corresponding to a circle 30 of which center coincides with the optical axis AX. The light entering surface of the immersed plane parallel plate Lp has substantially equal lengths in the two axial directions that are perpendicular to each other. The circumference of the light entering surface of the immersed plane parallel plate Lp may actually include a cutaway portion such as an orientation flat, the circumference of the light entering surface may actually have a polygonal shape, and the circumference of the light entering surface may actually have a holding tab that is flush with the light entering surface. In any case, the central axis of the circle 30 corresponding to the outer circumference of the light entering surface of the immersed plane parallel plate Lp coincides with the optical axis AX.

The effective light emitting region 31 is defined on the light emitting surface of the immersed plane parallel plate Lp as a region through which an effective imaging light beam passes. The effective light emitting region 31 corresponds to the rectangular effective exposure region (stationary exposure region) ER that is formed on the wafer W and that does not include the optical axis AX. The effective light emitting region 31 is decentered in one direction (Y-axis) with respect to the optical axis AX and has a rectangular shape with round corners. In the conventional technique, the light emitting surface of the immersed plane parallel plate Lp is rotationally symmetric (infinite-fold rotationally symmetric) with respect to the optical axis AX irrespective of the rotation asymmetry of the effective light emitting region 31. The light emitting surface of the immersion parallel plate Lp has substantially equal lengths in the two axial directions that are perpendicular to each other. Thus, the light emitting surface of the immersed plane parallel plate Lp has a circumference of which center coincides with the optical axis AX and corresponds to a large circle 32 that contains the effective light emitting region 31. As a result, the structure of the conventional technique enlarges the portion of the image space in the projection optical system PL that is filled with the liquid Lm 1. This consequently enlarges the substrate stage (9 to 11) and lowers the accuracy of the alignment optical system (not shown).

Figure 9A:
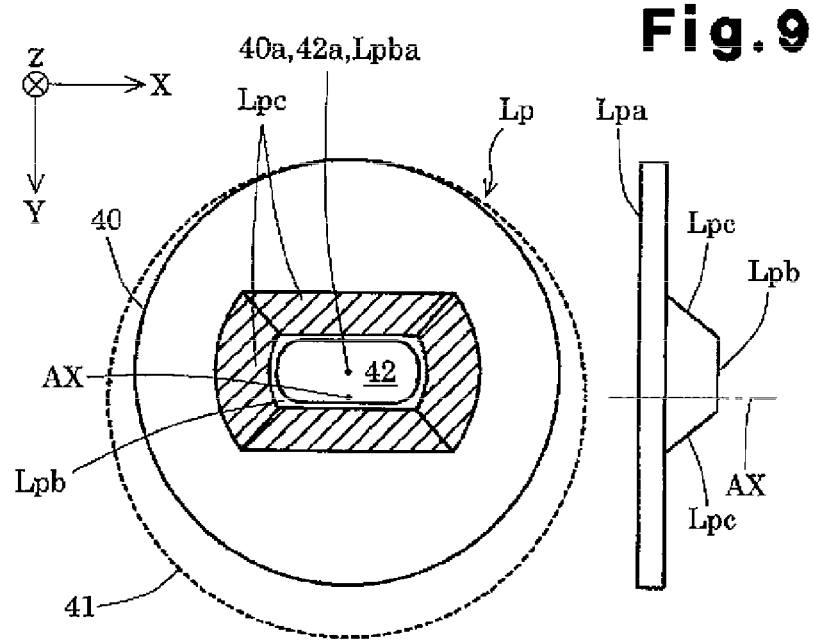
FIG. 9 is a schematic diagram showing the structure of an immersed plane parallel plate in each example of the present invention.
Figure 9C:
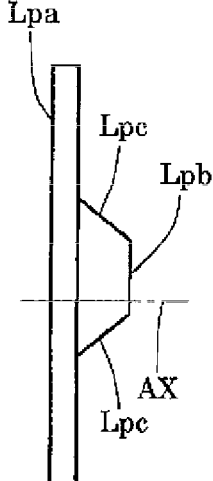
Figure 9B:
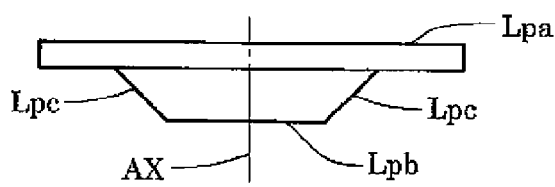

FIG. 9 is a schematic diagram showing the structure of an immersed plane parallel plate in each example of the present embodiment. FIG. 9(a) is a bottom view of the immersed plane parallel plate Lp, and FIGS. 9(b) and 9(c) are side views of the immersed plane parallel plate Lp. As shown in FIG. 9, a light entering surface Lpa of the immersed plane parallel plate Lp in each example of the present embodiment has a circumference corresponding to a circle 40. The circle 40, which corresponds to the circumference of the light entering surface Lpa, has a center 40a that is decentered in the Y-axis direction with respect to the optical axis AX (AX3). A reference circle indicated by a broken line 41 is a circle of which center coincides with the optical axis AX and that is inscribed in the circle 40. The light entering surface Lpa of the immersed plane parallel plate Lp has substantially equal lengths in the two axial directions (XY-axes directions) that are perpendicular to each other.

An effective light emitting region 42 formed on the light emitting surface Lpb of the immersed plane parallel plate Lp is substantially symmetric with respect to X-axis and Y-axis directions and has a rectangular shape with round corners. The effective light emitting region 42 has a center 42a that coincides with the center 40a of the circle 40 corresponding to the circumference of the light entering surface Lpa. The light emitting surface Lpb of the immersed plane parallel plate Lp is substantially symmetric with respect to the X-axis and Y-axis directions and contains the effective light emitting region 42 with a small marginal region formed around the effective light emitting region 42. The light emitting surface Lpb has a center Lpba that coincides with the center 42a of the effective light emitting region 42 and the center 40a of the circle 40 corresponding to the outer circumference of the light entering surface Lpa. From another point of view, the light emitting surface Lpb of the immersed plane parallel plate Lp is one-fold rotationally symmetric with respect to the optical axis AX. In FIG. 9(a), a hatched portion Lpc surrounding the light emitting surface Lpb shows a tilted surface that extends from the outer circumference of the light emitting surface Lpb toward the light entering side.

More specifically, in each example of the present invention, the light emitting surface Lpb of the immersed plane parallel plate Lp is substantially symmetric with respect to the two axial directions that are perpendicular to each other on the wafer W, that is, with respect to the X-axis and Y-axis directions. Further, the central axis Lpba of the light emitting surface Lpb and the central axis 40a of the circle 40 corresponding to the outer circumference of the light entering surface Lpa coincide with each other. The central axis Lpba of the light emitting surface Lpb is decentered in the Y-axis direction with respect to the optical axis AX. The central axis (barycenter axis) of the effective exposure region ER formed on the wafer W (the effective projection region of the projection optical system PL) substantially coincides with the central axis Lpba of the light emitting surface Lpb. The length of the light emitting surface Lpb in one axial direction (Y-axis) differs from the length of the light emitting surface Lpb in the other axial direction (X-axis).

As described above, the present embodiment differs from the prior art in that the portion of the image space in the projection optical system PL filled with liquid (immersion liquid) Lm1 can be reduced. In the conventional technique, the light emitting surface of the immersed plane parallel plate Lp is formed rotationally symmetric relative to the optical axis AX irrespective of the effective light emitting region 42 being rotationally asymmetric relative to the optical axis AX. In the present embodiment, the light emitting surface Lpb of the immersed plane parallel plate Lp is formed to be asymmetric relative to the optical axis AX in accordance with the shape of the effective exposure region ER (or the effective projection region of the projection optical system PL) that excludes the optical axis AX (i.e., formed so that the light emitting surface Lpb has different lengths in two axial directions (XY-axes directions) that are perpendicular to each other) on the wafer W. In the exposure apparatus of the preferred embodiment, the projection optical system PL of the present embodiment reduces the portion of the image space of the projection optical system PL filled with the liquid (immersion liquid) Lm1. The exposure apparatus of the present embodiment employs the high-resolution immersed projection optical system PL that reduces the portion of the image space in the projection optical system PL filled with liquid (immersion liquid) Lm1. Thus, a micropattern can be projected and exposed with high accuracy without enlarging the substrate stages (9 to 11) or lowering the accuracy of the alignment optical system.

FIG. 10 is a schematic diagram showing the structure of an immersed plane parallel plate according to a first modification of the present embodiment. FIG. 10(a) is a bottom view of the immersed plane parallel plate Lp, and FIGS. 10(b) and 10(c) are side views of the immersed plane parallel plate Lp. As shown in FIG. 10, a light entering surface Lpa of the immersed plane parallel plate Lp according to the first modification has an outer circumference corresponding to a circle 50 of which center coincides with an optical axis AX (AX3). The light entering surface Lpa of the immersed plane parallel plate Lp has substantially equal lengths in the two axial directions (XY-axis directions) that are perpendicular to each other. An effective light emitting region 51 formed on a light emitting surface Lpb of the immersed plane parallel plate Lp is substantially symmetric in the X-axis and Y-axis directions and has a rectangular shape with round corners. The effective light emitting region 51 has a center 51a decentered in the Y-axis direction from the optical axis AX.

The light emitting surface Lpb of the immersed plane parallel plate Lp is substantially symmetric with respect to X-axis and Y-axis directions and contains the effective light emitting region 51 with a small marginal region formed at one long side and the two short sides of the effective light emitting region 51 and a relatively large marginal region formed at the other long side of the effective light emitting region 51. In FIG. 10(a), a hatched portion Lpc surrounding the light emitting surface Lpb shows a tilted surface that extends from the circumference of the light emitting surface Lpb toward the light entering side.

More specifically, the light emitting surface Lpb of the immersed plane parallel plate Lp according to the first modification is substantially symmetric with respect to the X-axis and Y-axis directions. From another point of view, the light emitting surface Lpb of the immersed plane parallel plate Lp is two-fold rotationally symmetric with respect to the optical axis AX. Further, the central axis Lpba (not shown in FIG. 10)

of the light emitting surface Lpb and the central axis 50*a* (not shown in FIG. 10) of the circle 50 corresponding to the circumference of the light entering surface Lpa coincide with the optical axis AX. The central axis (barycenter axis) of an effective exposure region ER (an effective projection region of the projection optical system PL) formed on the wafer W is decentered in the Y-axis direction from the central axis Lpba (the optical axis AX). The length of the light emitting surface Lpb in one axial direction (Y-axis) differs from the length of the light emitting surface Lpb in the other axial direction (X-axis).

In the same manner as the embodiment shown in FIG. 9, in the first modification shown in FIG. 10, the portion of the image space in the projection optical system PL filled with liquid (immersion liquid) Lm1 can be reduced. This is because the light emitting surface Lpb of the immersed plane parallel plate Lp is formed to be asymmetric relative to the optical axis AX in accordance with the shape of the effective exposure region ER (or the effective projection region of the projection optical system PL) that excludes the optical axis AX (i.e., formed so that the light emitting surface Lpb has different lengths in two axial directions (XY-axes directions) that are perpendicular to each other) on the wafer W.

Figure 11:
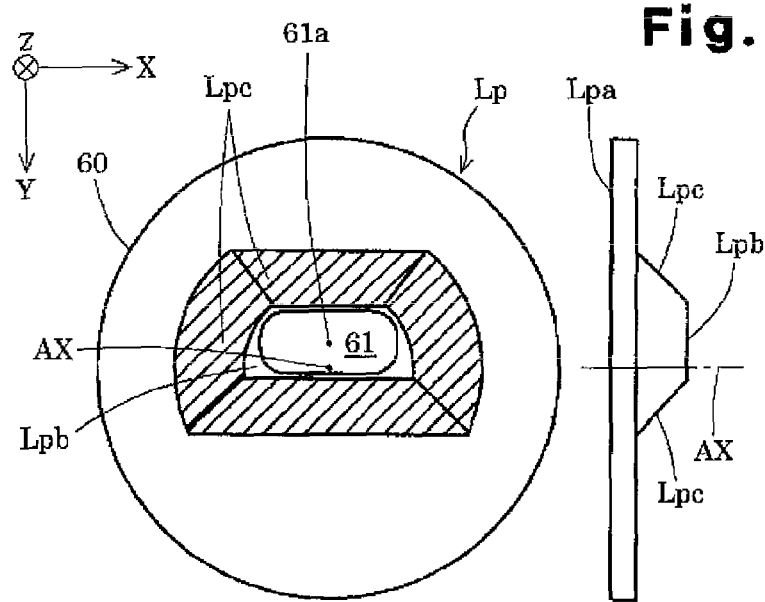
FIG. 11 is a schematic diagram showing the structure of an immersed plane parallel plate according to a second modification of the present embodiment.
Figure 11:
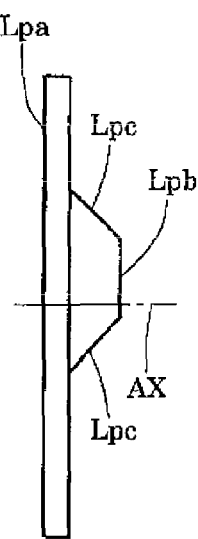
Figure 11:
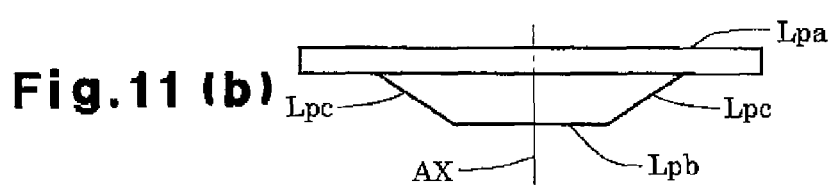

FIG. 11 is a schematic diagram showing the structure of an immersed plane parallel plate according to a second modification of the present embodiment. FIG. 11(*a*) is a bottom view of the immersed plane parallel plate Lp, and FIGS. 11(*b*) and 11(*c*) are side views of the immersed plane parallel plate Lp. As shown in FIG. 11, a light entering surface Lpa of the immersed plane parallel plate Lp according to the second modification has a circumference corresponding to a circle 60 of which center coincides with an optical axis AX (AX3). An effective light emitting region 61 of a light emitting surface Lpb of the immersed plane parallel plate Lp is substantially symmetric with respect to X-axis and Y-axis and has a rectangular shape with round corners. The effective light emitting region 61 has a center 61*a* of decentered in the Y-axis direction from the optical axis AX. The length of the light emitting surface Lpb in one axial direction (Y-axis) differs from the length of the light emitting surface Lpb in another axial direction (X-axis).

The light emitting surface Lpb of the immersed plane parallel plate Lp is substantially symmetric with respect to the Y-axis direction and asymmetric with respect to the X-axis and contains the effective light emitting region 61 with a small marginal region formed around the effective light emitting region 61. A center (barycenter axis) Lpba of the light emitting surface Lpb (not shown in FIG. 11) is in the vicinity (vicinity in the Y-axis direction) of the center 61*a* of the effective light emitting region 61. In FIG. 11(*a*), a hatched portion Lpc surrounding the light emitting surface Lpb shows a tilted surface that extends from the circumference of the light emitting surface Lpb toward the light entering side.

More specifically, the light emitting surface Lpb of the immersed plane parallel plate Lp according to the second modification is substantially symmetric with respect to the Y-axis direction and asymmetric with respect to X-axis. The length of the light emitting surface Lpb in one axial direction (Y-axis direction) differs from the length of the light emitting surface Lpb in the other axial direction (X-axis direction). Further, the circle 60, which corresponds to the circumference of the light entering surface Lpa, has a central axis 60*a* (not shown in FIG. 11) that coincides with the optical axis AX coincide with each other, and the central axis (barycenter axis) Lpba of the light emitting surface Lpb is decentered in the Y-axis direction from the optical axis AX. The central axis (barycenter axis) of an effective exposure region ER (an effective projection region of the projection optical system PL) formed on the wafer W substantially coincides with the central axis (barycenter axis) Lpba of the light emitting surface Lpb. From another point of view, the light emitting surface Lpb of the immersed plane parallel plate Lp of the second modification is one-fold rotationally symmetric with respect to the optical axis AX.

In the same manner as the embodiment shown in FIG. 9, in the second modification shown in FIG. 11, the portion of the image space in the projection optical system PL filled with liquid (immersion liquid) Lm1 can be reduced. This is because the light emitting surface Lpb of the immersed plane parallel plate Lp is formed to be asymmetric relative to the optical axis AX in accordance with the shape of the effective exposure region ER (or the effective projection region of the projection optical system PL) that excludes the optical axis AX (i.e., formed so that the light emitting surface Lpb has different lengths in two axial directions (XY-axes directions) that are perpendicular to each other) on the wafer W.

Figures 12A, 12B, 12C:
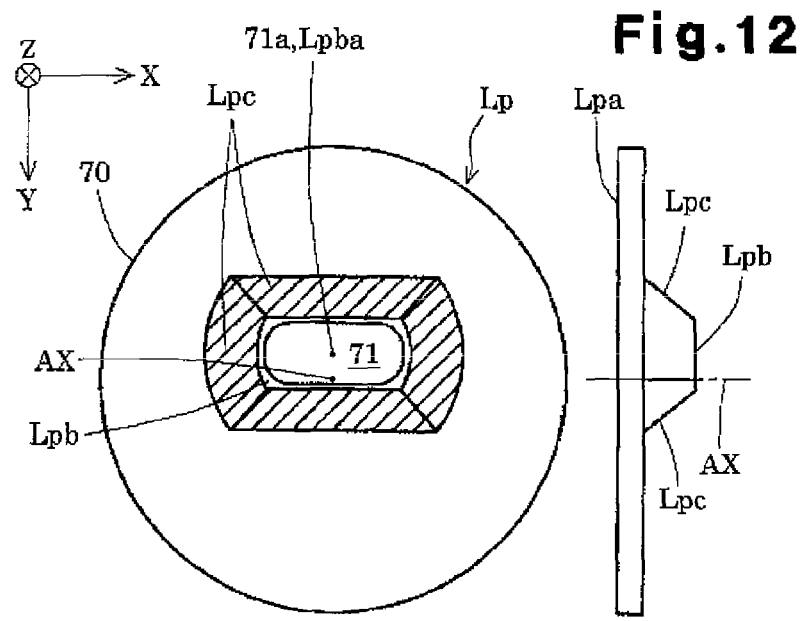
FIG. 12 is a schematic diagram showing the structure of an immersed plane parallel plate according to a third modification of the present embodiment.

FIG. 12 is a schematic diagram showing the structure of an immersed plane parallel plate according to a third modification of the present embodiment. FIG. 12(*a*) is a bottom view of the immersed plane parallel plate Lp, and FIGS. 12(*b*) and 12(*c*) are side views of the immersed plane parallel plate Lp. As shown in FIG. 12, a light entering surface Lpa of the immersed plane parallel plate Lp according to the third modification has a circumference corresponding to a circle 70 of which center coincides with an optical axis AX (AX3). The light entering surface Lpa of the immersed plane parallel plate Lp has substantially equal lengths in the two axial directions (XY-axes directions) that are perpendicular to each other. An effective light emitting region 71 of a light emitting surface Lpb of the immersed plane parallel plate Lp is substantially symmetric with respect to X-axis and Y-axis directions and has a rectangular shape with round corners. The effective light emitting region 71 has a center 71*a* decentered in the Y-axis direction from the optical axis AX.

The light emitting surface Lpb of the immersed plane parallel plate Lp is substantially symmetric with respect to the X-axis and Y-axis directions and contains the effective light emitting region 71 with a small marginal region formed around the effective light emitting region 71. The light emitting surface Lpb has a center Lpba that coincides with the center 71*a* of the effective light emitting region 71. In FIG. 12(*a*), a hatched portion Lpc surrounding the light emitting surface Lpb shows a tilted surface that extends from the circumference of the light emitting surface Lpb toward the light entering side.

More specifically, the light emitting surface Lpb of the immersed plane parallel plate Lp according to the third modification is substantially symmetric with respect to the X-axis and Y-axis directions. The length of the light emitting surface Lpb in one axial direction (Y-axis) differs from the length of the light emitting surface Lpb in the other axial direction (X-axis). Further, the central axis 70*a* (not shown in FIG. 12) of the circle 70 corresponding to the circumference of the light entering surface Lpa coincides with the optical axis AX, and the central axis Lpba of the light emitting surface Lpb is decentered in the Y-axis direction from the optical axis AX. The central axis (barycenter axis) of an effective exposure region ER (an effective projection region of the projection optical system PL) on the wafer W substantially coincides with the central axis Lpba of the light emitting surface Lpb. From another point of view, the light emitting surface Lpb of the immersed plane parallel plate Lp of the third modification is one-fold rotationally symmetric with respect to the optical axis AX.

In the same manner as the embodiment shown in FIG. 9, in the third modification shown in FIG. 12, the portion of the image space in the projection optical system PL filled with liquid (immersion liquid) Lm1 can be reduced. This is because the light emitting surface Lpb of the immersed plane parallel plate Lp is formed to be asymmetric relative to the optical axis AX in accordance with the shape of the effective exposure region ER (or the effective projection region of the projection optical system PL) that excludes the optical axis AX (i.e., formed so that the light emitting surface Lpb has different lengths in two axial directions (XY-axes directions) that are perpendicular to each other) on the wafer W. The structures of the first to third modifications are only examples, and the structures of the light entering surface and the light emitting surface of the immersed plane parallel plate Lp may be modified in various manners within the scope of the present invention.

In the above embodiment, the plane parallel plate (optical member that typically has substantially no refractive power) Lp is arranged in the optical path formed between the interface lens Lb and the wafer W. Thus, even when pure water, which is used as the immersion liquid, is contaminated with gases generated from photoresist coated on the wafer W, the plane parallel plate Lp arranged between the interface lens Lp and the wafer W effectively prevents the image-side optical surface of the interface lens Lb from being contaminated with such contaminated pure water. Further, the refractive index of the liquid (pure water Lm1 and Lm2) and the refractive index of the plane parallel plate Lp only slightly differ from each other. This significantly reduces requirements on the posture and the positional accuracy of the plane parallel plate Lp. The contaminated plane parallel plate Lp can easily be replaced when necessary. Thus, the optical performance of the projection optical system PL can easily be restored.

Further, the immersed plane parallel plate Lp functions to reduce pressure fluctuations during scanning and exposure performed with the liquid Lm2 that comes in contact with the interface lens Lp or reduce pressure fluctuations during a step movement. In this case, liquid is accommodated in a relatively small space. However, the above embodiment is not limited to the described structure. For example, the plane parallel plate Lp may be eliminated. In this case, the present invention may be applied to the interface lens Lb, which is the refractive optical element arranged nearest to the imaging position (to the wafer W). More specifically, the structure of the first modification shown in FIG. 10, the structure of the second modification shown in FIG. 11, or the structure of the third modification shown in FIG. 12 may be applied to the light entering surface and the light emitting surface of the interface lens Lb. In such cases, the interface lens Lb has the same advantages as described in the above embodiment of the present invention. The structure of the embodiment shown in FIG. 9, in which the center of the circle corresponding to the circumference of the light entering surface is decentered from the optical axis AX, is not applicable to the light entering surface of the interface lens Lb.

In the above embodiment, the present invention is applied to an off-axis catadioptric optical system of which the effective field of view excludes the optical axis. However, the application of the present invention is not limited in such a manner. The present invention is applicable to other typical immersion projection optical systems. As described above, the application of the present invention to the catadioptric and off-axis optical system ensures the flatness of an image and increases the variety of patterns of images that can be formed. In the catadioptric and off-axis optical system according to each example that forms an image through an imaging operation performed three times, the effective exposure region ER is formed nearer to the optical axis AX. This reduces the rotational asymmetry of the refractive optical element (the plane parallel plate Lp or the interface lens Lb) arranged nearest to the imaging position (to the wafer W). This projection optical system is easy to manufacture, and the structure of the apparatus using this projection optical system can be simplified.

In the above embodiment, the pure water (Lm1 and Lm2) is used as the liquid filled in the optical path between the interface lens Lb and the wafer W. A liquid having a refractive index higher than the pure water (e.g., a liquid having a refractive index of 1.6 or more) may be used instead. Examples of such high-refractive index liquids include glycenol (concentrated glycerin/fructose) ($CH_2[OH]CH[OH]CH_2[OH]$) and heptane ($C_7H_{16}$). Other examples include water containing $H^+$, $Cs^-$, $K^+$, $Cl^-$, $SO_4^{2-}$, or $PO_4^{2-}$, water containing particles of oxide of aluminum, isopropanol, hexane, heptane, decane, Delphi (cyclic hydrocarbon compound) manufactured by Mitusi Chemicals, Inc., HIF-001 manufactured by JSR Corporation, and IF131, IF132, and IF175 manufactured by E. I. du Pont de Nemours and Company.

When such a high-refractive index liquid is used, it is preferable that some of the lenses in the projection optical system PL, in particular, lenses near the image surface (to the wafer W), be formed from a material having a high refractive index. In this case, the size of the projection optical system PL or particularly the diameter dimension of the projection optical system PL is reduced. It is preferable that a crystalline material, such as calcium oxide, magnesium oxide, barium fluoride, strontium oxide, barium oxide, barium fluoride, barium lithium fluoride ($BaLiF_3$), lutetium aluminum garnet (LuAG), or crystalline magnesium aluminum spinel ($MgAl_2O_4$), or mixed crystal mainly composed of such a crystalline material be used as the high-refractive index material.

This realizes a high numerical aperture with a feasible size. When, for example, an ArF excimer laser (having a wavelength of 193 nm) is used, the projection optical system PL achieves a high numerical aperture of about 1.5 or more. When an $F_2$ laser having a wavelength of 157 nm is used as the exposure beam IL, it is preferable to use a liquid enabling transmission of an $F_2$ laser beam, specifically, a fluorinated fluid, such as perfluoropolyalkyether (PFPE), or fluorinated oil as the liquid that fills the image space portion.

The exposure apparatus of the above embodiment illuminates the reticle (mask) using an illumination apparatus (an illumination process) and exposes a transfer pattern in the mask onto the photosensitive substrate using the projection optical system (an exposure process). Through the illumination and exposure processes, the exposure apparatus manufactures microdevices (semiconductor devices, imaging devices, liquid crystal display devices, or thin-film magnetic heads). A method for manufacturing a microdevice or specifically a semiconductor device through formation of a predetermined circuit pattern on a wafer or the like as a photosensitive substrate using the exposure apparatus of the present embodiment will now be described with reference to a flowchart shown in FIG. 13.

Figure 13:
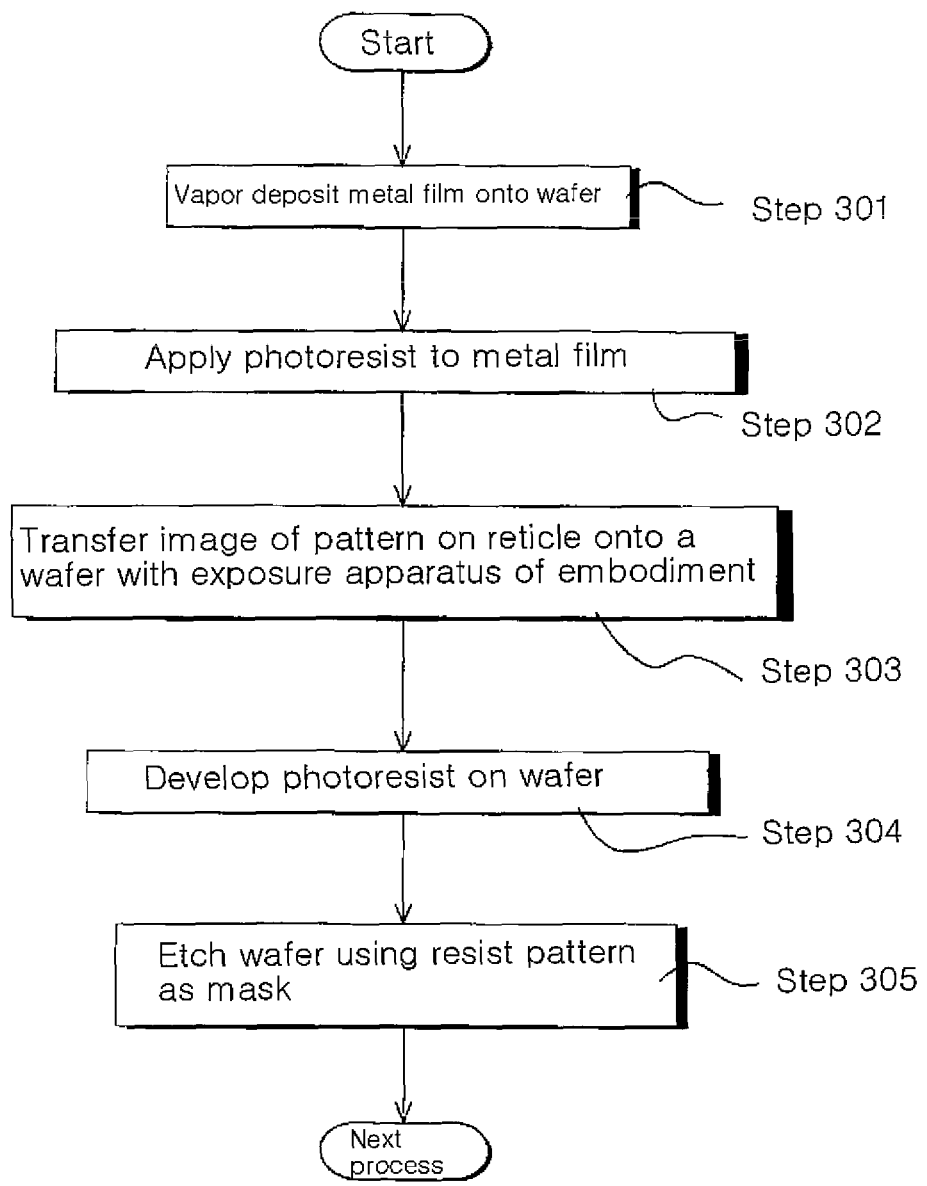
FIG. 13 is a flowchart showing a method for forming a microdevice, which serves as a semiconductor device.

In step S301 in FIG. 13, a metal film is first formed on wafers of a single lot through vapor deposition. In step S302, photoresist is applied to a metal film formed on each wafer of the single lot. In step S303, the exposure apparatus of the present invention is used to sequentially expose and transfer an image of a pattern in a mask onto shot-regions of each wafer in the single lot with the projection optical system.

Then, in step S304, the photoresist formed on each wafer of the single lot is developed. In step S305, each wafer of the single lot is etched using the resist pattern formed on the wafer as a mask. This forms a circuit pattern corresponding to the mask pattern in the shot-regions of each wafer.

Afterwards, circuit patterns corresponding to upper layers are formed to complete the semiconductor device or the like. With the semiconductor device manufacturing method described above, a semiconductor device with an extremely fine circuit pattern is produced with high throughput. In steps S301 to S305, metal is deposited on the wafer through vapor deposition, resist is coated on the metal film, and then processes in which the resist is exposed, developed, and etched are performed. Prior to these processes, a silicon oxide film may first be formed on the wafer, and the resist may be coated on the silicon oxide film. Then, the processes in which the resist is exposed, developed, and etched may be performed.

Figure 14:
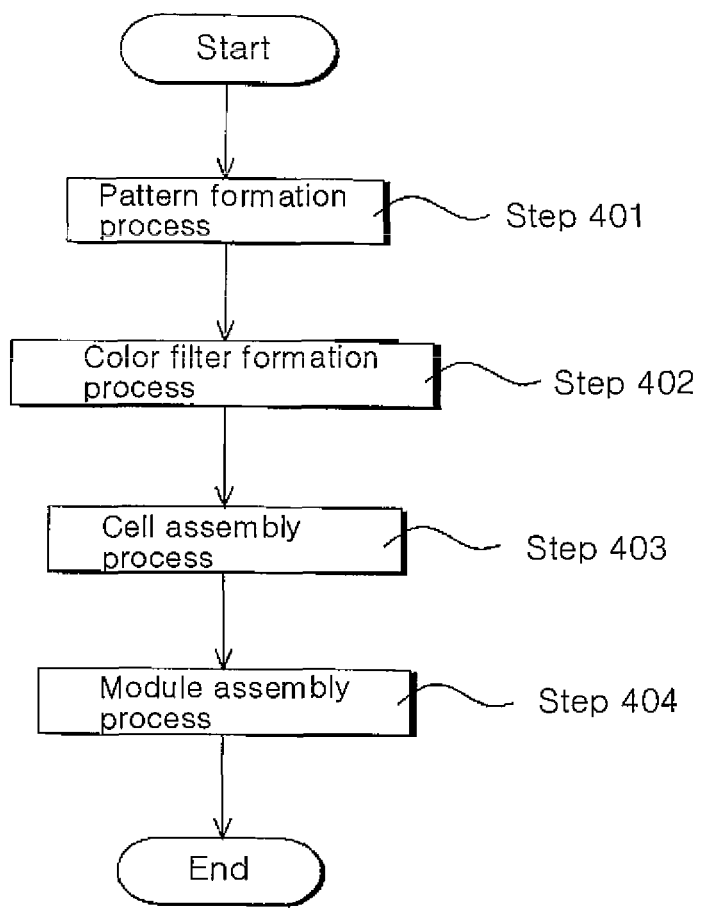
FIG. 14 is a flowchart showing a method for forming a microdevice, which serves as a liquid crystal display device.

The exposure apparatus of the present embodiment may also be used to produce a liquid crystal display device serving as a microdevice by forming a predetermined pattern (a circuit pattern or an electrode pattern) on a plate (glass substrate). One example method for manufacturing a liquid crystal display device will now be described with reference to a flowchart shown in FIG. 14. In FIG. 14, a pattern formation process is performed in step S401. In step S401, a mask pattern is transferred and exposed onto a photosensitive substrate (e.g., a glass substrate coated with resist) using the exposure apparatus of the present embodiment. In other words, a photolithography process is performed. Through the photolithography process, a predetermined pattern including, for example, a large number of electrodes is formed on the photosensitive substrate. Afterwards, a predetermined pattern is formed on the substrate through processes including a developing process, an etching process, and a resist removing process. Then, a color filter formation process is performed in step S402.

In step S402, a color filter is formed by, for example, arranging plural sets of R (red), G (green), and B (blue) dots in a matrix, or arranging plural of sets of filters formed by R, G, and B stripes in horizontal scanning line directions. After the color filter formation process is performed in step S402, a cell assembly process is performed in step S403. In step S403, the substrate having a predetermined pattern obtained through the pattern formation process performed in step S401 and the color filter or the like obtained through the color filter formation process performed in step S402 are assembled together to form the liquid crystal panel (liquid crystal cell).

In S403, for example, a liquid crystal is injected between the substrate having the predetermined pattern obtained through the pattern formation process performed in S401 and the color filter obtained through the color filter formation process performed in S402 to form the liquid crystal panel (liquid crystal cell). In a module assembly process performed subsequently in step S404, an electric circuit for enabling the assembled liquid crystal panel (liquid crystal cell) to perform a display operation and other components including a backlight are mounted. This completes the liquid crystal display device. The liquid crystal display device manufacturing method described above enables a liquid crystal device having an extremely fine circuit pattern to be produced with high throughput.

Although the ArF excimer laser light source is used in the above embodiment, other appropriate light sources, such as an $F_2$ laser light source, may be used. When an $F_2$ laser beam is used as the exposure beam, a fluorinated liquid enabling transmission of an $F_2$ laser beam, such as fluorinated oil or perfluoropolyalkyether (PFPE), is used as the liquid that fills the image space portion.

The present invention is applied to an immersion projection optical system that is mounted on the exposure apparatus in the above embodiment. However, the application of the present invention is not limited to such an optical system. The present invention is applicable to other typical immersion projection optical systems. The present invention is also applicable to an immersion objective optical system that uses a refractive optical element of which optical surface comes in contact with liquid.

Although the interface lens Lp and the immersed plane parallel plate Lp are formed from silica, which is an amorphous material, in the above embodiment, the interface lens Lb and the immersed plane parallel plate Lp do not have to be made of silica. For example, the interface lens Lb and the immersed plane parallel plate Lp may be formed from a crystalline material, such as magnesium oxide, calcium oxide, strontium oxide, or barium oxide.

Although pure water is used as the first liquid and the second liquid in the above embodiment, the first and second liquids should not be limited to pure water. For example, water containing $H^+$, $Cs^+$, $K^+$, $Cl^-$, $SO_4^{2-}$, or $PO_4^{2-}$, or isopropanol, glycerol, hexane, heptane, or decane may be used as the first and second liquids.

We claim:

1. A projection optical system which projects an image of a first plane onto a second plane through a liquid, the projection optical system comprising:
   a refractive optical element arranged nearest to the second plane;
   wherein the refractive optical element includes a light emitting surface shaped to be rotationally asymmetric with respect to an optical axis of the projection optical system based on a shape of an effective projection region formed on the second plane.

2. The projection optical system according to claim 1, wherein the light emitting surface of the refractive optical element is one-fold rotationally symmetric with respect to the optical axis of the projection optical system.

3. The projection optical system according to claim 1, wherein the light emitting surface of the refractive optical element is shaped to be substantially symmetric with respect to two axial directions perpendicular to each other on the second plane, the light emitting surface has a central axis that substantially coincides with a central axis of a circle corresponding to a circumference of a light entering surface of the refractive optical element, and the central axis of the light emitting surface is decentered in one of the two axial directions from the optical axis of the projection optical system.

4. The projection optical system according to claim 1, wherein the light emitting surface of the refractive optical element is shaped to be substantially symmetric with respect to one of two axial directions perpendicular to each other on the second plane and asymmetric with respect to the other one of the axial directions, a central axis of a circle corresponding to a circumference of a light entering surface of the refractive optical element substantially coincide with the optical axis of the projection optical system, and the light emitting surface has a central axis decentered in the one of the axial directions.

5. The projection optical system according claim 1, wherein the light emitting surface of the refractive optical element is shaped to be substantially symmetric with respect to two axial directions perpendicular to each other on the second plane, a central axis of a circle corresponding to a circumference of a light entering surface of the refractive optical element substantially coincide with the optical axis of the projection optical system, and the light emitting surface has a central axis decentered in one of the two axial directions from the optical axis of the projection optical system.

6. The projection optical system according to claim 3, wherein a central axis of the effective projection region substantially coincides with the central axis of the light emitting surface.

7. The projection optical system according to claim 1, wherein the light emitting surface of the refractive optical element is two-fold rotationally symmetric with respect to the optical axis of the projection optical system.

8. The projection optical system according to claim 1, wherein the refractive optical element is an interface lens of which a first plane side comes in contact with gas and a second plane side comes in contact with the liquid.

9. The projection optical system according to claim 1, wherein the refractive optical element is arranged in an optical path formed between the second plane and an interface lens of which a first plane side comes in contact with gas and a second plane side comes in contact with the liquid, and the light emitting surface of the refractive optical element is substantially parallel to a light entering surface of the refractive optical element.

10. The projection optical system according to claim 1, wherein a reduced image of the first plane is projected onto the second plane through the liquid.

11. The projection optical system according to claim 1, wherein a center of an effective projection region on the second plane is decentered from the optical axis of the projection optical system.

12. The projection optical system according to claim 1, further comprising:
at least one concave reflective mirror and a plurality of refractive optical elements, wherein an effective field of view region on the first plane and the effective projection region on the second plane excludes the optical axis.

13. The projection optical system according to claim 12, further comprising:
a refractive first imaging optical system which forms a first intermediate image based on light from the first plane;
a second imaging optical system including the at least one concave reflective mirror, which forms a second intermediate image based on light from the first intermediate image; and
a refractive third imaging optical system which forms the image on the second plane based on light from the second intermediate image.

14. The projection optical system according to claim 13, further comprising:
a first deflection mirror arranged in an optical path between the first imaging optical system and the second imaging optical system; and
a second deflection mirror arranged in an optical path between the second imaging optical system and the third imaging optical system.

15. The projection optical system according to claim 1, wherein the light emitting surface of the refractive optical element includes a planar surface.

16. The projection optical system according to claim 1, wherein the refractive optical element includes a light entering surface having a planar surface.

17. An exposure apparatus comprising:
the projection optical system according to claim 1 for projecting an image of a predetermined pattern onto a photosensitive substrate that is set on the second plane based on illumination light from the pattern set on the first plane.

18. The exposure apparatus according to claim 17, wherein the pattern is projected while changing a positional relationship of the image of the pattern and the photosensitive substrate in a scanning direction.

19. The exposure apparatus according to claim 17, further comprising:
a supply and discharge mechanism for supplying and discharging the liquid.

20. A device manufacturing method comprising:
an exposure step of projecting and exposing an image of a pattern set on the first plane onto a photosensitive substrate set on the second plane with the projection optical system according to claim 1; and
a development step of developing the photosensitive substrate that has undergone the exposure step.

21. The device manufacturing method according to claim 20, wherein in the exposure step include projecting the pattern while changing a positional relationship of the image of the pattern and the photosensitive substrate in a scanning direction.

* * * * *